US012812961B2

(12) United States Patent
Wang et al.

(10) Patent No.: US 12,812,961 B2
(45) Date of Patent: Nov. 24, 2026

(54) BARRIER LAYER FOR WEAKENED BOUNDARY EFFECT

(71) Applicant: Taiwan Semiconductor Manufacturing Company, Ltd., Hsinchu (TW)

(72) Inventors: Yu-Xuan Wang, New Taipei (TW); Cheng-Chun Tseng, Hsinchu (TW); Yi-Chun Chen, Hsinchu (TW); Yu-Hsien Lin, Kaohsiung (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 880 days.

(21) Appl. No.: 18/153,553

(22) Filed: Jan. 12, 2023

(65) Prior Publication Data

US 2024/0112957 A1 Apr. 4, 2024

Related U.S. Application Data

(60) Provisional application No. 63/377,796, filed on Sep. 30, 2022.

(51) Int. Cl.
*H10D 84/03* (2025.01)
*H10D 84/01* (2026.01)
*H10D 84/85* (2025.01)

(52) U.S. Cl.
CPC ....... *H10D 84/038* (2025.01); *H10D 84/0177* (2025.01); *H10D 84/853* (2025.01)

(58) Field of Classification Search
CPC . H10D 84/038; H10D 84/853; H10D 84/0177
See application file for complete search history.

(56) References Cited

U.S. PATENT DOCUMENTS

| | | | | |
|---|---|---|---|---|
| 7,927,943 | B2 | 4/2011 | Yeh et al. | |
| 11,127,628 | B1 | 9/2021 | Shih | |
| 2021/0407862 | A1 * | 12/2021 | More | H10D 64/017 |

FOREIGN PATENT DOCUMENTS

| | | | |
|---|---|---|---|
| TW | 1393220 | B | 4/2013 |
| TW | 202137461 | A | 10/2021 |

* cited by examiner

*Primary Examiner* — Christine A Enad
(74) *Attorney, Agent, or Firm* — Ingrassia Fisher & Lorenz, LLP | IF&L

(57) ABSTRACT

A fabrication method is disclosed that includes: forming a first metal layer over first and second semiconductor structures; forming a first patterned photolithographic layer with an opening that exposes a portion of the first metal layer over the first semiconductor structure but not to a boundary between semiconductor structures; removing the exposed portion of the first metal layer; forming a second metal layer over the first and second semiconductor structures; forming a second patterned photolithographic layer with an opening that exposes a portion of the second metal layer over the second semiconductor structure but not to the boundary; removing the exposed portion of the first and second metal layers; wherein a barrier structure is generated between the first and second semiconductor structures that includes remaining portions of the first metal layer and a portion of the second metal layer overlying the remaining portions of the first metal layer.

20 Claims, 22 Drawing Sheets

BARRIER LAYER FOR WEAKENED BOUNDARY EFFECT

CROSS-REFERENCE TO RELATED APPLICATION

This application claims the benefit of U.S. Provisional Application No. 63/377,796, filed Sep. 30, 2022.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
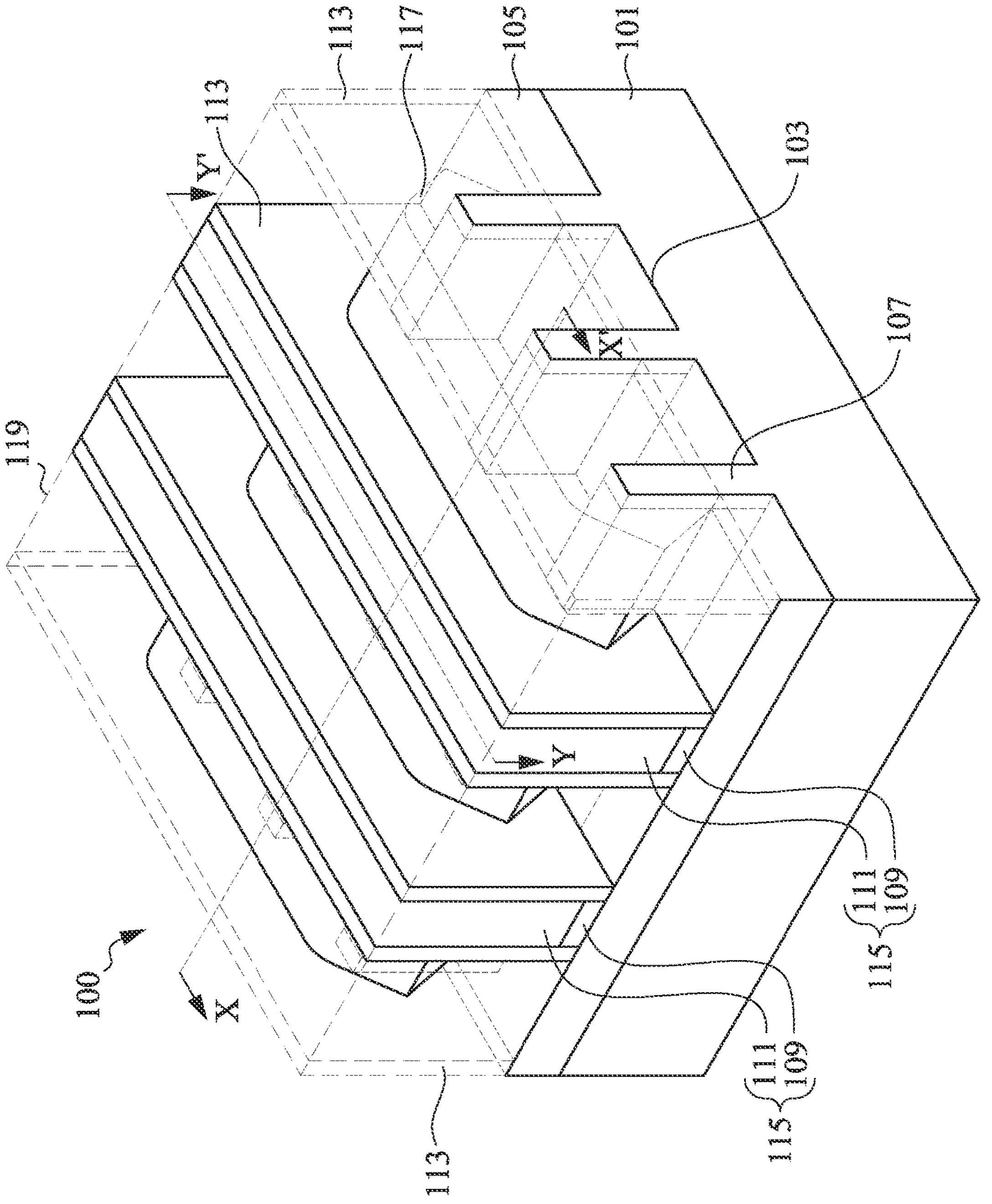
FIG. 1A a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being “on” another element or layer, it is directly on and in contact with the other element or layer.

With reference now to FIG. 1A, there is illustrated a perspective view of a semiconductor device 100 such as a FinFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device. For example, the use of epitaxially grown silicon germanium may degrade (with respect to silicon) the interfacial defects of the device.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching processes additionally form fins 107 from those portions of the substrate 101 that remain unremoved. These fins 107 may be used to form the channel region of multiple-gate FinFET transistors. While FIG. 1A only illustrates three of the fins 107 formed from the substrate 101, any number of fins 107 may be utilized.

Furthermore, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, dummy gate dielectrics 109, dummy gate electrodes 111 over the dummy gate dielectrics 109, and spacers 113 may be formed over each of the fins 107. In an embodiment the dummy gate dielectrics 109 may be formed by thermal oxidation, chemical vapor deposition, sputtering, or any other methods known and used in the art for forming a gate dielectric. Depending on the technique of gate dielectric formation, the dummy gate dielectrics 109 thickness on the top of the fins 107 may be different from the gate dielectric thickness on the sidewall of the fins 107.

The dummy gate dielectrics 109 may comprise a material such as silicon dioxide or silicon oxynitride. The dummy gate dielectrics 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof. Additionally, any combination of silicon dioxide, silicon oxynitride, and/or high-k materials may also be used for the dummy gate dielectrics 109.

The dummy gate electrodes 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrodes 111 may be deposited by chemical vapor deposition (CVD), sputter deposition, or other techniques known and used in the art for depositing conductive materials. The top surface of the dummy gate electrodes 111 may have a non-planar top surface, and may be planarized prior to patterning of the dummy gate electrodes 111 or gate etch. Ions may or may not be introduced into the dummy gate electrodes 111 at this point. Ions may be introduced, for example, by ion implantation techniques.

Once formed, the dummy gate dielectrics 109 and the dummy gate electrodes 111 may be patterned to form a series of dummy stacks 115 over the fins 107. The dummy stacks 115 define multiple channel regions located on each side of the fins 107 beneath the dummy gate dielectrics 109. The dummy stacks 115 may be formed by depositing and patterning a gate mask (not separately illustrated in FIG. 1A) on the dummy gate electrodes 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride. The dummy gate electrodes 111 and the dummy gate dielectrics 109 may be etched using a dry etching process to form the patterned in the dummy stacks 115.

Figure 1B:
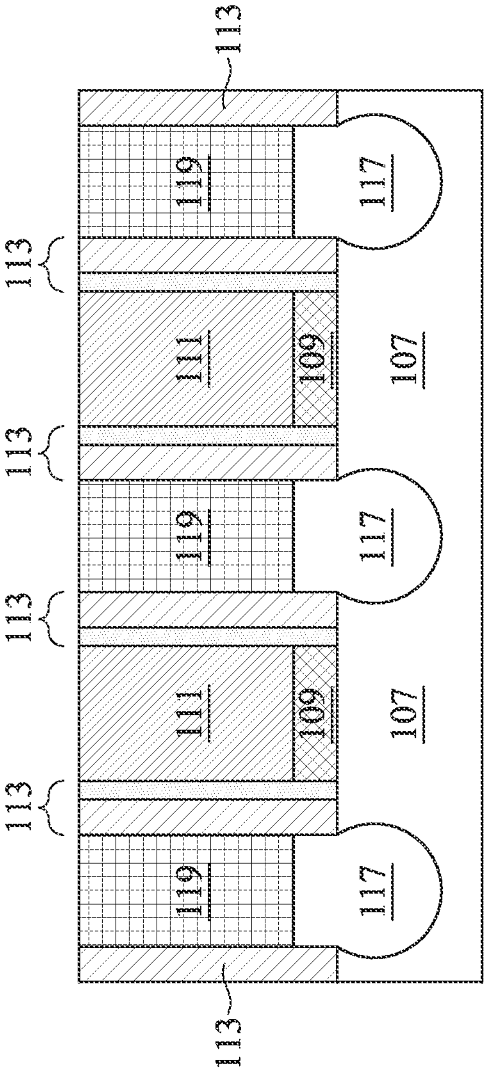
FIG. 1B illustrates a cross-sectional view of FIG. 1A along cutline X-X', in accordance with some embodiments.

Once the dummy stacks 115 have been patterned, the spacers 113 may be formed. The spacers 113 may be formed on opposing sides of the dummy stacks 115. The spacers 113 may be formed by blanket depositing one (as illustrated in FIG. 1A for clarity) or more (as illustrated in FIG. 1B) spacer layers on the previously formed structure. The one or more spacer layers may comprise SiN, oxynitride, SiC, SiON, SiOCN, SiOC, oxide, and the like and may be formed by methods utilized to form such layers, such as chemical vapor deposition (CVD), plasma enhanced CVD, sputter, and other methods known in the art. In embodiments with more than one spacer layer, the one or more spacer layers may be formed in similar manners using similar materials, but different from one another, such as by comprising materials having different component percentages and with different curing temperatures and porosities. Furthermore, the one or more spacer layers may comprise a different material with different etch characteristics or the same material as the dielectric material within the first isolation regions 105. The one or more spacer layers may then be patterned, such as by one or more etches to remove the one or more spacer layers from the horizontal surfaces of the structure. As such, the one or more spacer layers are formed along sidewalls of the dummy stacks 115 and are collectively referred to as the spacers 113.

FIG. 1A further illustrates a removal of the fins 107 (although the location of the fins 107 is still illustrated in FIG. 1A to show where they were originally located) from those areas not protected by the dummy stacks 115 and the spacers 113 and a regrowth of source/drain regions 117. Source/drain region(s) may refer to a source or a drain, individually or collectively dependent upon the context. The removal of the fins 107 from those areas not protected by the dummy stacks 115 and the spacers 113 may be performed by a reactive ion etch (RIE) using the dummy stacks 115 and the spacers 113 as hard masks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrodes 111 to prevent growth and the source/drain regions 117 may be regrown in contact with each of the fins 107. In an embodiment the source/drain regions 117 may be regrown and, in some embodiments the source/drain regions 117 may be regrown to form a stressor that will impart a stress to the channel regions of the fins 107 located underneath the dummy stacks 115. In an embodiment wherein the fins 107 comprise silicon and the FinFET is a p-type device, the source/drain regions 117 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the source/drain regions 117 are formed, dopants may be implanted into the source/drain regions 117 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks 115 and the spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally, at this point the hard mask that covered the dummy gate electrodes 111 during the formation of the source/drain regions 117 is removed. In an embodiment the hard mask may be removed using, e.g., a wet or dry etching process that is selective to the material of the hard mask. However, any suitable removal process may be utilized.

FIG. 1A also illustrates a formation of a first interlayer dielectric (ILD) layer 119 (illustrated in dashed lines in FIG. 1A in order to illustrate more clearly the underlying structures) over the dummy stacks 115 and the source/drain regions 117. The first ILD layer 119 may comprise a material such as boron phosphorous silicate glass (BPSG), although any suitable dielectrics may be used. The first ILD layer 119 may be formed using a process such as PECVD, although other processes, such as LPCVD, may alternatively be used. Once formed, the first ILD layer 119 may be planarized with the spacers 113 using, e.g., a planarization process such as chemical mechanical polishing process, although any suitable process may be utilized.

FIG. 1B illustrates a cross-sectional view of FIG. 1A along cutline X-X' in order to better illustrate the formation of gate contacts, gate vias, source/drain contacts, and source/drain vias, according to some embodiments.

Figure 1C:
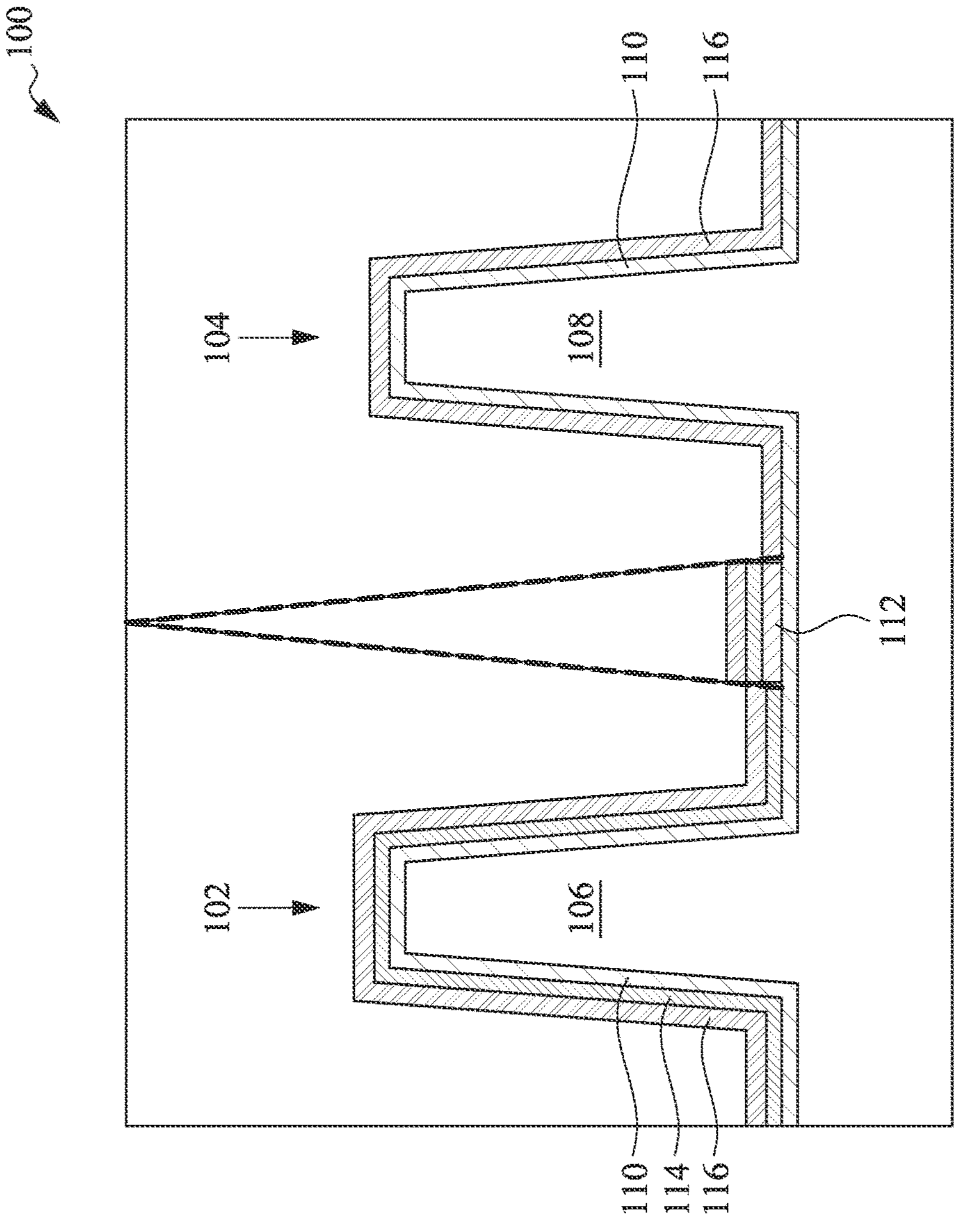
FIG. 1C schematically illustrates a portion of the example semiconductor device in a two-dimensional view along cutline Y-Y' at a future stage of fabrication, in accordance with some embodiments.

FIG. 1C schematically illustrates a portion of the example semiconductor device 100 in a two-dimensional view along cutline Y-Y' at a future stage of fabrication. Other aspects not illustrated in or described with respect to FIG. 1C may become apparent from the following figures and description. The semiconductor device 100 may be part of an IC, such as a microprocessor, memory cell (such as static random-access memory (SRAM)), and/or other integrated circuits. In some embodiments, the semiconductor device 100 includes P-type structures 102 and N-type structures 104. In the depicted example, the P-type structures 102 include one epitaxial growth layer 106 for p-type field effect transistors (FETs) (referred to herein as p-EPI layers) formation, and the N-type structures 104 include one epitaxial growth layer 108 for n-type FETs (referred to herein as n-EPI layers). The depicted example EPI layers 106, 108 are intermediate structures during fabrication of non-planar FETs such as fin field-effect transistor (FinFETs), gate-all-around (GAA) FETs, or others.

Deposited around the example EPI layers 106, 108 are an interfacial layer (IL) 110 with a high K value and gate material. The gate material is patterned such that a first work function metal layer 112 is formed as a barrier layer between the P-type structure 102 and N-type structure 104, a second work function metal layer 114 and a third work function metal layer 116 are deposited over the p-EPI layers 106, and the third work function metal layer 116 without the first work function metal layer 112 or the second work function metal layer is deposited over the n-EPI layer 108. The second work function metal layer 114 is configured to set a stable threshold voltage (Vt) for the p-type FETs that are constructed from the p-EPI layers 106.

Through patterning operations, a barrier layer 112 is formed between the P-type structure 102 and N-type structure 104. When a P-type metal gate transistor borders an N-type metal gate transistor, contamination may occur through metal diffusion across the boundary between the P-type and N-type metal gate transistors. Such contamination may degrade the threshold Voltage ($V_t$) of the metal gate transistors. The barrier layer 112 can provide protection against a "boundary effect" that may occur at an N/P boundary.

Figure 2:
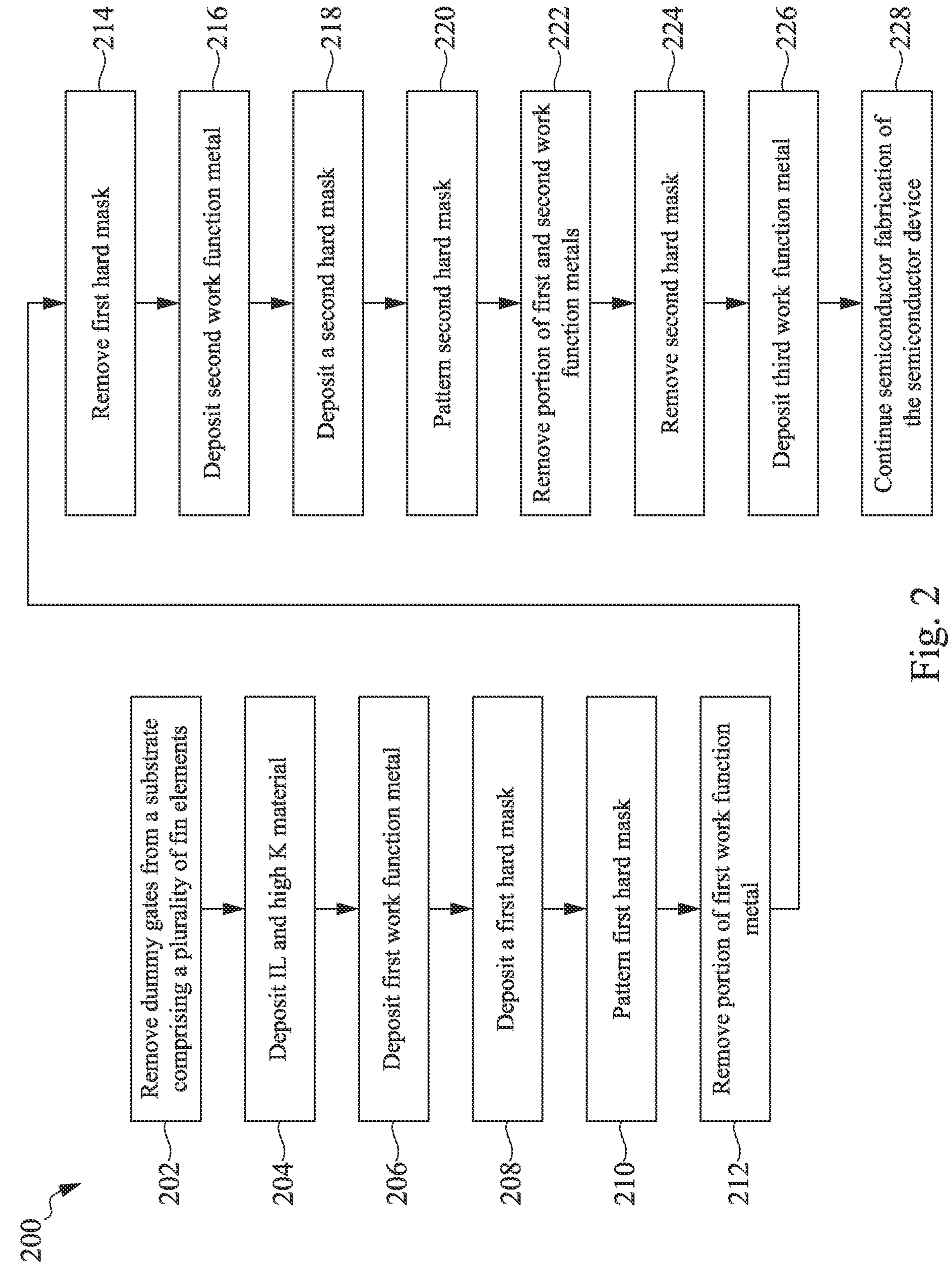
FIG. 2 is a process flow chart depicting an example process for forming metal gate stacks in a semiconductor device with a barrier layer between different types of adjacent transistors, in accordance with some embodiments.

FIG. 2 is a process flow chart depicting an example process 200 for forming metal gate stacks in a semiconductor device with a barrier layer between different types of adjacent transistors, according to various aspects of the present disclosure. FIG. 2 is described in conjunction with FIGS. 3A-3K, which are cross-sectional views of a semiconductor device, which illustrate the semiconductor device at various stages of fabrication in accordance with some embodiments of the present disclosure of the example process 200. The process 200 is merely an example, and is not intended to limit the present disclosure beyond what is explicitly recited in the claims. Additional steps may be provided before, during, and after example process 200, and some of the steps described can be moved, replaced, or eliminated for additional embodiments of example process 200. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 200, including any descriptions given with reference to the Figures are merely exemplary and are not intended to be limiting beyond what is specifically recited in the claims that follow.

FIGS. 3A-3K are diagrams depicting enlarged views of an example area 300 at various stages of fabricating a semiconductor device, in accordance with some embodiments. In some figures, some reference numbers of components or features illustrated therein may be omitted to avoid obscuring other components or features; this is for ease of depicting the figures.

At block 202, the example process 200 includes removing dummy gates from a substrate having a plurality of different types of transistors in close proximity to each other. The dummy gate electrode and/or gate dielectric may be removed by suitable etching processes. Referring to the example of FIG. 3A, in an embodiment of block 202, the example area 300 includes a substrate 302 with a plurality of N-type structures (NFETs) 304 and a P-type structure (e.g., PFET) 306 disposed over the semiconductor substrate 302. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. For example, different doping profiles (e.g., n wells, p wells) may be formed on the substrate 302 in regions designed for different device types (e.g., p-type field effect transistors (PFET), n-type field effect transistors (NFET)). The suitable doping may include ion implantation of dopants and/or diffusion processes. The substrate 302 typically has isolation features (e.g., shallow trench isolation (STI) features) interposing the regions providing different device types. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

At block 204, the example process 200 includes depositing an interfacial layer (IL) over the transistor structures and a high-K material dielectric layer over the IL. Referring to the example of FIG. 3B, in an embodiment of block 204, the example area 300 includes an IL and a high-K material dielectric layer 308 deposited over the N-type structures 304 and the P-type structure 306. In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. High-K gate dielectrics, as used and described herein, include dielectric materials having a high dielectric constant, for example, greater than that of thermal silicon oxide (~3.9). The High-K gate dielectric layer may include a high-K dielectric layer such as hafnium oxide ($HfO_2$). Alternatively, the High-K gate dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

At block 206, the example process 200 includes depositing a first work function metal. Referring to the example of FIG. 3B, in an embodiment of block 206, the example area 300 includes a first work function metal layer 310 deposited over the IL and high-K material dielectric layer 308. The first work function metal layer may include a transition metal, such as TiN or any suitable materials or a combination thereof. The first work function metal layer 310 may be deposited by CVD, ALD and/or other suitable processes.

At block 208, the example process 200 includes depositing a first hard mask. Referring to the example of FIG. 3C, in an embodiment of block 208, the example area 300 includes a first hard mask 312 deposited over the area 300. The first hard mask 312, such as a bottom anti-reflective coating (BARC) and/or photoresist (PR) material is disposed over the example area 300. The BARC layer may be an organic material coated onto the substrate filling trenches and then removed from portions of the substrate after patterning, such as by using photolithography with a photoresist layer.

At block 210, the example process 200 includes patterning the first hard mask. The first hard mask is patterned to expose an opening for removing a portion of a first work function metal. The first hard mask may be patterned using a patterning rule that exposes a portion of the first metal layer over the first transistor type such as a P-type structure up to a first predetermined distance to a boundary between the first transistor type and the second transistor type. Referring to the example of FIG. 3D, in an embodiment of block 210, the example area 300 includes the first hard mask 312 patterned to expose an opening 313 over the P-type structure 306. A photolithography process is performed to form patterned layers over the area 300. The patterned layers may include a bottom anti-reflective coating (BARC) and a photoresist layer. The BARC layer may be an organic material coated onto the substrate filling trenches and then removed from portions of the substrate after patterning, such as by using photolithography with the photoresist layer. In one embodiment, the patterned layers expose certain regions, such as regions corresponding to the P-type FinFET structure 306 to allow processing over regions of the P-type FinFET structure 306 up to a first predetermined distance to a boundary 311 between the first transistor type and the second transistor type while leaving the remaining regions intact. In various embodiments, the boundary 311 separates regions corresponding to the P-type FinFET structure 306 from regions corresponding to the N-type FinFET structure 304.

At block 212, the example process 200 includes removing a portion of first work function metal. The portion of the first work function metal removed includes first work function metal over a first transistor type such as a P-type structure but not completely to the boundary to an adjacent transistor of a second transistor type such as a N-type structure. Referring to the example of FIG. 3D, in an embodiment of block 212, the example area 300 includes the portion of first work function metal in the opening 313 having been removed over a first transistor type such as a P-type structure 306 but not completely to the boundary 311 to an adjacent transistor of a second transistor type such as a N-type structure 304. The portion of first work function metal may be removed from the P-type structure via wet etching operations. For example, the etching process may be performed by dipping, immersing, or soaking the substrate with or in an etching solution in a wet tank.

At block 214, the example process 200 includes removing the first hard mask. Referring to the example of FIG. 3E, in an embodiment of block 214, the example area 300 includes the first hard mask 312 having been removed. The hard mask may be removed, for example, by an ashing process. For example, an ashing process using oxygen plasma may be used to remove the BARC layer.

At block 216, the example process 200 includes depositing a second work function metal. Referring to the example of FIG. 3F, in an embodiment of block 216, the example area 300 includes a second work function metal layer 314 deposited over the area 300. The second work function metal layer may include a transition metal, such as TiN or any suitable materials or a combination thereof. The second work function metal layer 314 may be deposited by atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. The second work function metal layer 314 may have the same chemical composition as the first work function metal layer 310. The material of the second work function metal layer 314 is chosen to tune a work function value so that a desired threshold voltage (Vt) is achieved in the device that is to be formed in the respective region. In this example, the second work function metal layer 314 comprises a p-type work function material that can provide a desired work function value for the gate electrode of a P-type transistor.

At block 218, the example process 200 includes depositing a second hard mask. Referring to the example of FIG. 3G, in an embodiment of block 218, the example area 300 includes a second hard mask 316 deposited over the area 300. The second hard mask 316, such as a bottom anti-reflective coating (BARC) and/or photoresist (PR) material is disposed over the example area 300. The BARC layer may be an organic material coated onto the substrate filling trenches and then removed from portions of the substrate after patterning, such as by using photolithography with a photoresist layer.

At block 220, the example process 200 includes patterning the second hard mask. The second hard mask is patterned to expose an opening for removing a portion of a second work function metal. The second hard mask may be patterned using a patterning rule that exposes a portion of the second metal layer over the second semiconductor structure up to a second predetermined distance to the boundary between the first semiconductor structure and the second semiconductor structure. Referring to the example of FIG. 3H, in an embodiment of block 220, the example area 300 includes the second hard mask 316 patterned to expose an opening 317 over the N-type structures 304. A photolithography process is performed to form patterned layers over the area 300. The patterned layers may include a bottom anti-reflective coating (BARC) and/or a photoresist layer. The BARC layer may be an organic material coated onto the substrate filling trenches and then removed from portions of the substrate after patterning, such as by using photolithography with the photoresist layer. In one embodiment, the patterned layers expose certain regions, such as regions corresponding to the N-type FinFET structures 304 to allow processing over regions of the N-type FinFET structure 304 up to a second predetermined distance to the boundary 311 between the first semiconductor structure and the second semiconductor structure while leaving the remaining regions intact.

At block 222, the example process 200 includes removing the portion of the second work function metal and underlying portions of the first work function metal. The removed portions of the first and second work function metals include first and second work function metals over the second transistor type such as a N-type structure but not completely to the boundary to an adjacent transistor of the first transistor type such as a P-type structure. Referring to the example of FIG. 3I, in an embodiment of block 222, the example area 300 includes the portions of the first and second work function metal layers in the opening 313 having been removed over the second transistor type such as the N-type structure 304 but not completely to the boundary 311 to an adjacent transistor of a first transistor type such as an P-type structure 306. The portions of the first and second work function metals may be removed via wet etching operations. For example, the etching process may be performed by dipping, immersing, or soaking the substrate with or in an etching solution in a wet tank.

The masking pattern for removal of the first work function metal layer 310 and the masking pattern for removal of the second work function metal layer 314 are selectively chosen to create a barrier layer comprising the remaining portion of the first work function metal layer 310 at the boundary 311 between the different transistor types. When a N-type metal gate transistor borders a P-type metal gate transistor, contamination may occur through metal diffusion across the boundary 311 between the N-type and P-type metal gate transistors. Such contamination may degrade the threshold Voltage ($V_t$) of the metal gate transistors. The barrier layer formed from the first work function metal layer 310 can provide protection against a “boundary effect” that may occur at an N/P boundary 311. An overlay area with work function metal layers 1 and 2 at boundary 311 can reduce some physical diffusion of substance to achieve a blocking effect. For example, the overlay area at the boundary 311 can reduce 3rd work function metal Al ion lateral diffusion to high K material.

At block 224, the example process 200 includes removing the second hard mask. Referring to the example of FIG. 3J, in an embodiment of block 224, the example area 300 includes the second hard mask 316 having been removed. The hard mask may be removed, for example, by an ashing process. For example, an ashing process using oxygen plasma may be used to remove the BARC layer.

At block 226, the example process 200 includes depositing a third work function metal layer. Referring to the example of FIG. 3K, in an embodiment of block 226, the example area 300 includes a third work function metal layer 318 deposited over the area 300 and a barrier layer region 330 formed through selective masking patterns for removal of the first work function metal layer 310 and removal of the second work function metal layer 314 around boundary regions between transistors. In this example, the third work function metal layer 318 comprises an n-type work function material, such as TiAl, that can provide a desired work function value for the gate electrode of a N-type transistor. The N-type work function material can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

In addition to the first work function metal layer 310, the second work function metal layer 314, and the third work function metal layer 318, the gate structure may comprise different or additional layers. Additional layers may include diffusion layers, adhesion layers, combinations, or multiple layers thereof, or the like. The additional layers may be deposited by ALD, CVD, PVD, or the like.

At block 228, the example process 200 includes continuing semiconductor fabrication of the semiconductor device. Also, additional fabrication operations not described in process 200 can occur before, between, and after the blocks 202-226 included in process 200.

A semiconductor device may undergo further processing to form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 3A:
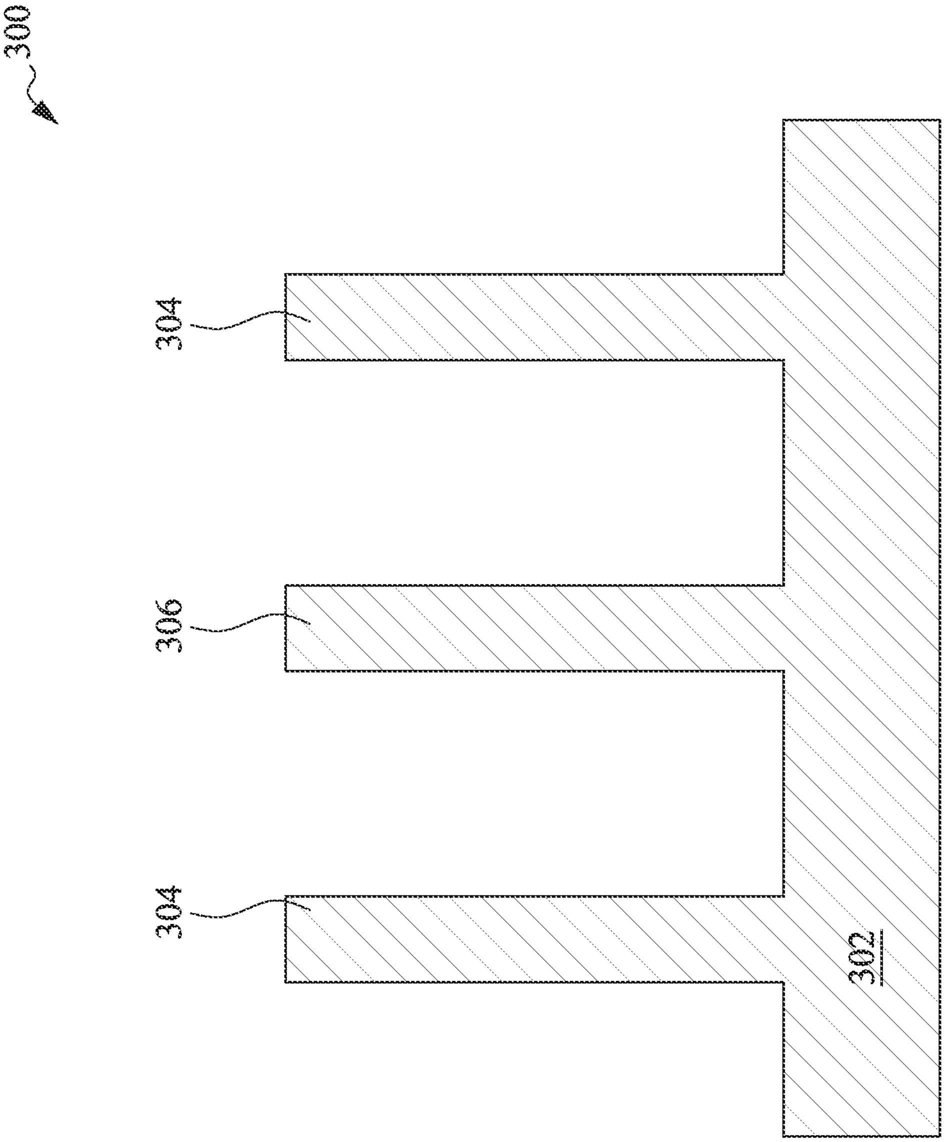
FIGS. 3A-3L are diagrams depicting enlarged views of an example area at various stages of fabricating a semiconductor device, in accordance with some embodiments.
Figure 3B:
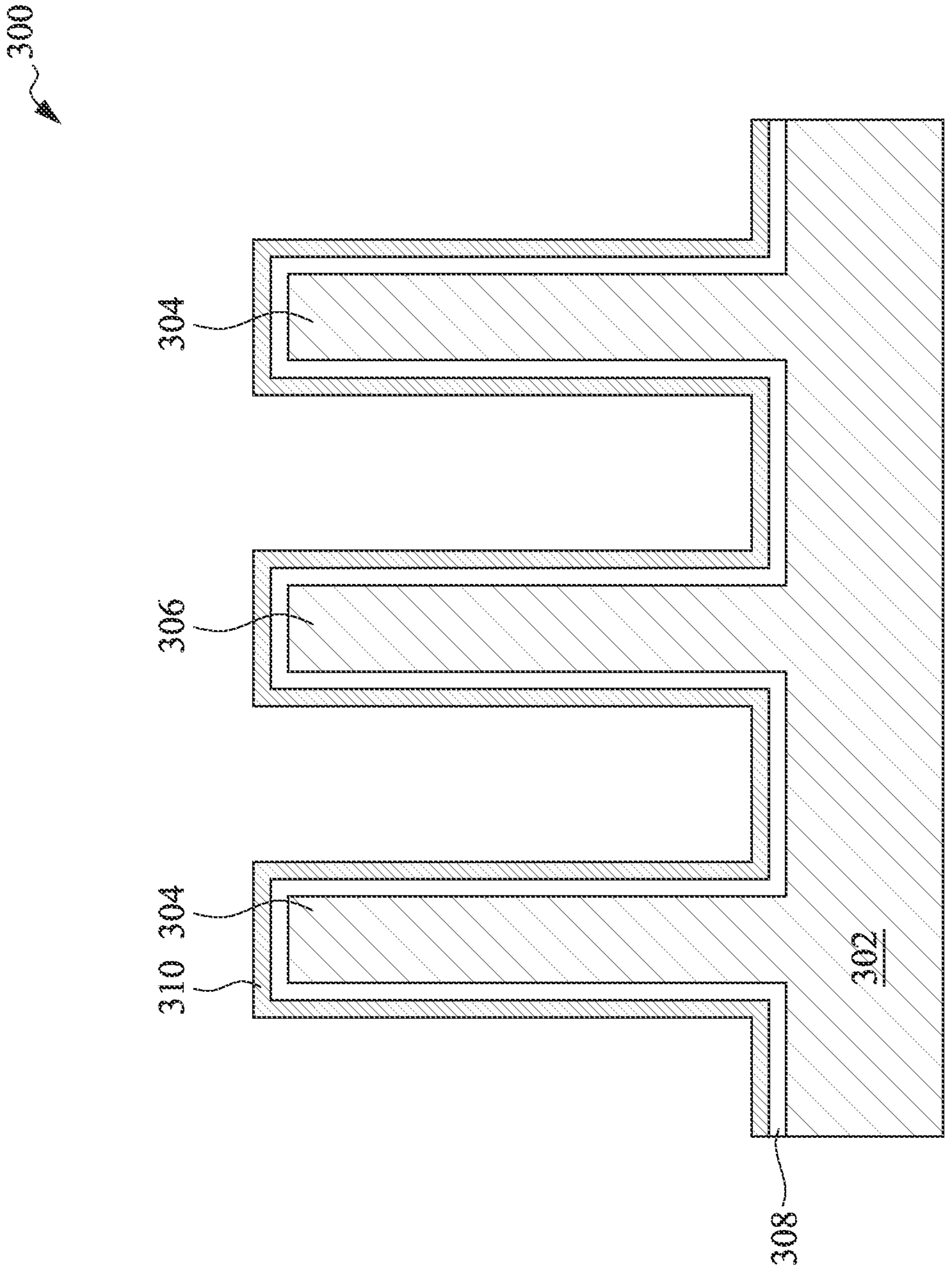
Figure 3C:
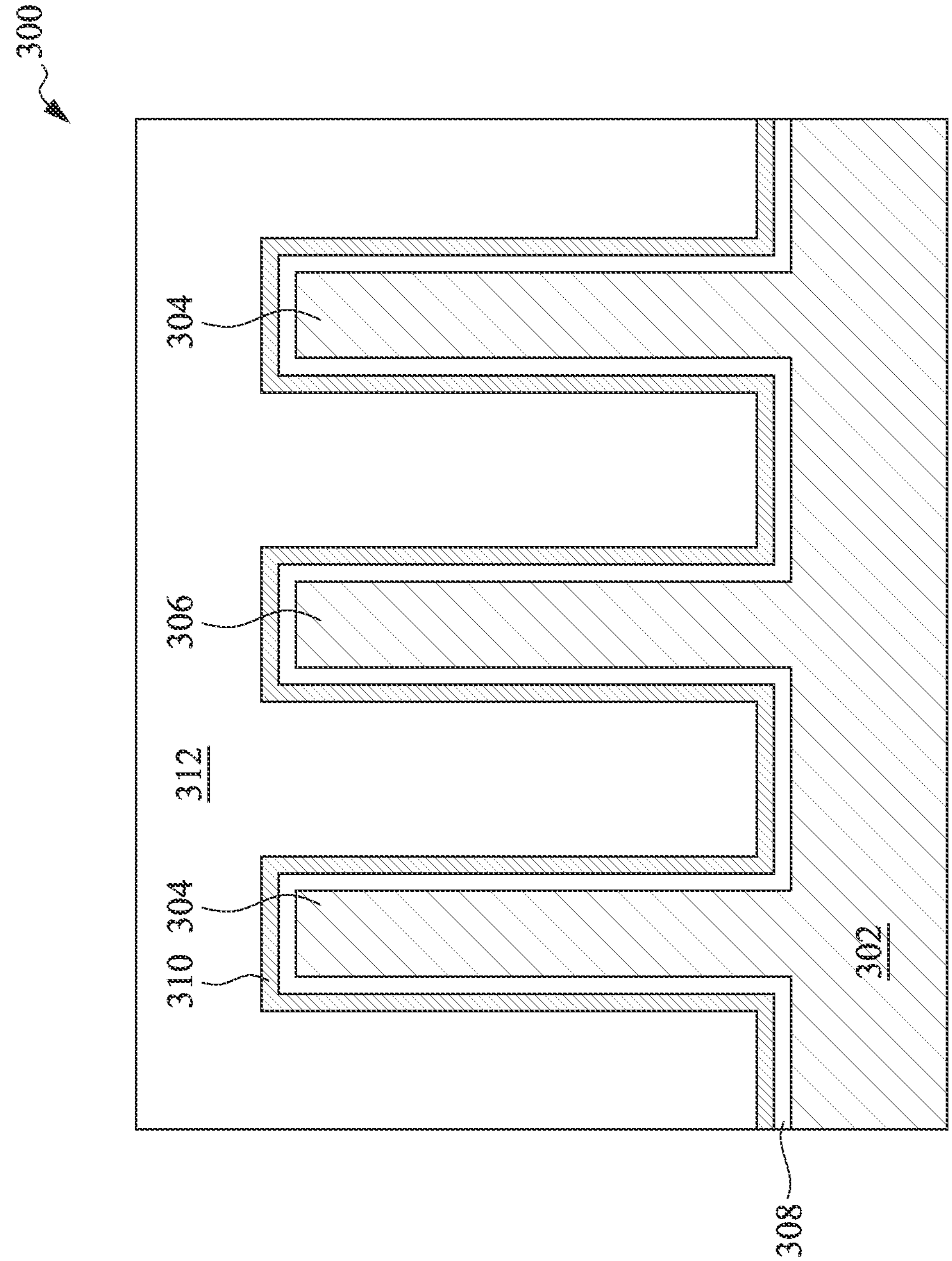
Figure 3D:
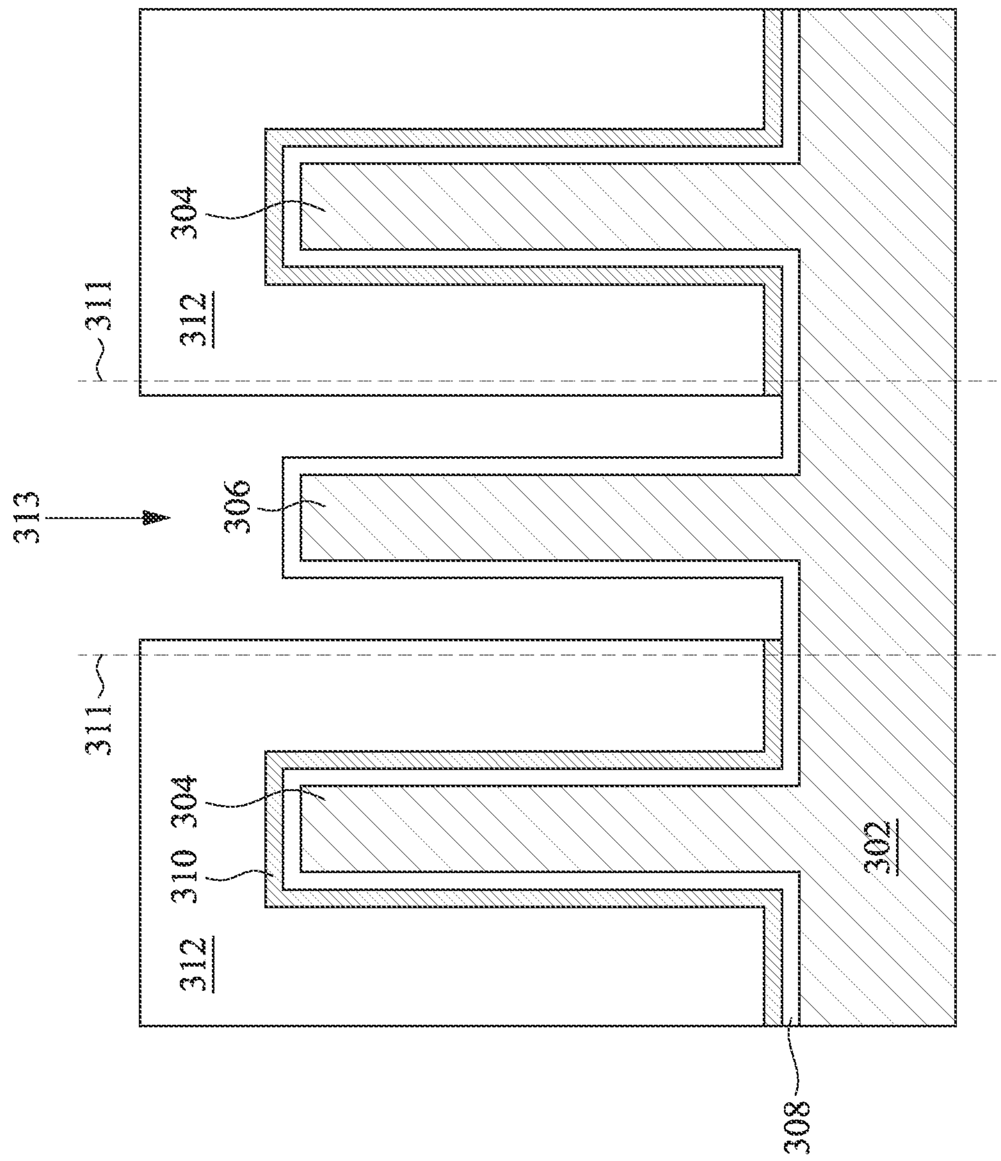
Figure 3E:
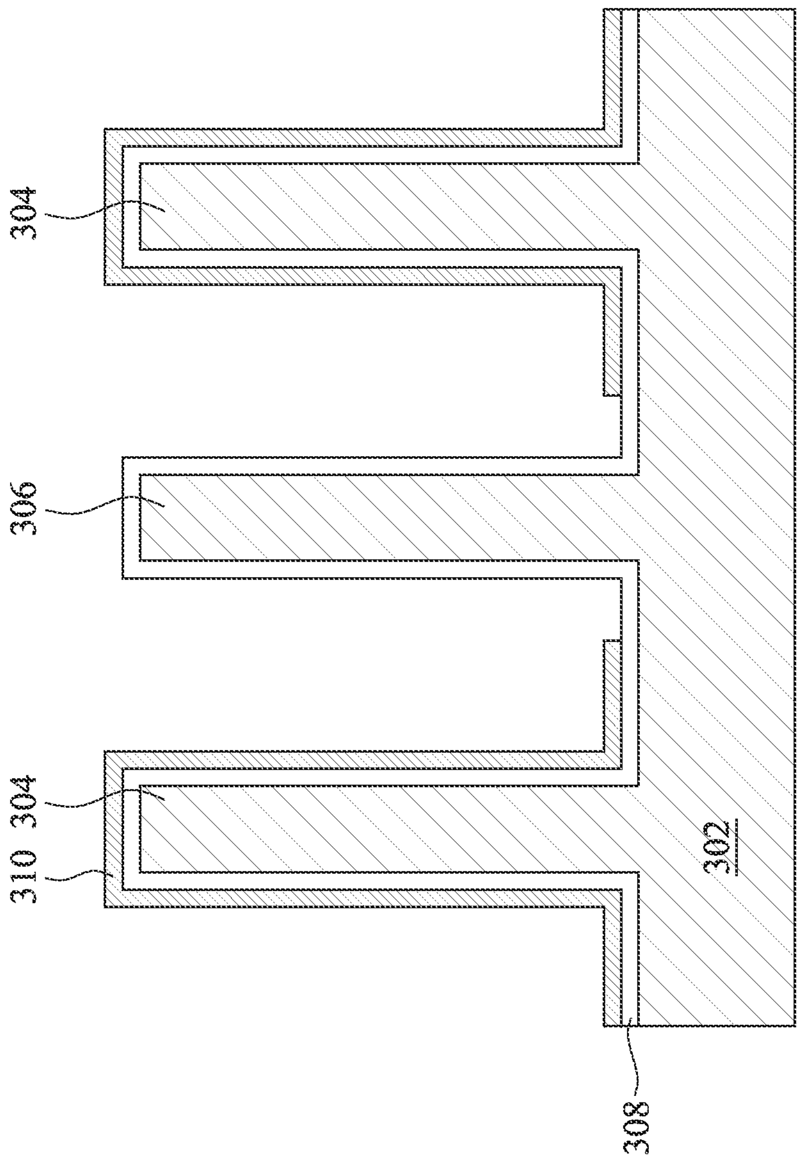
Figure 3F:
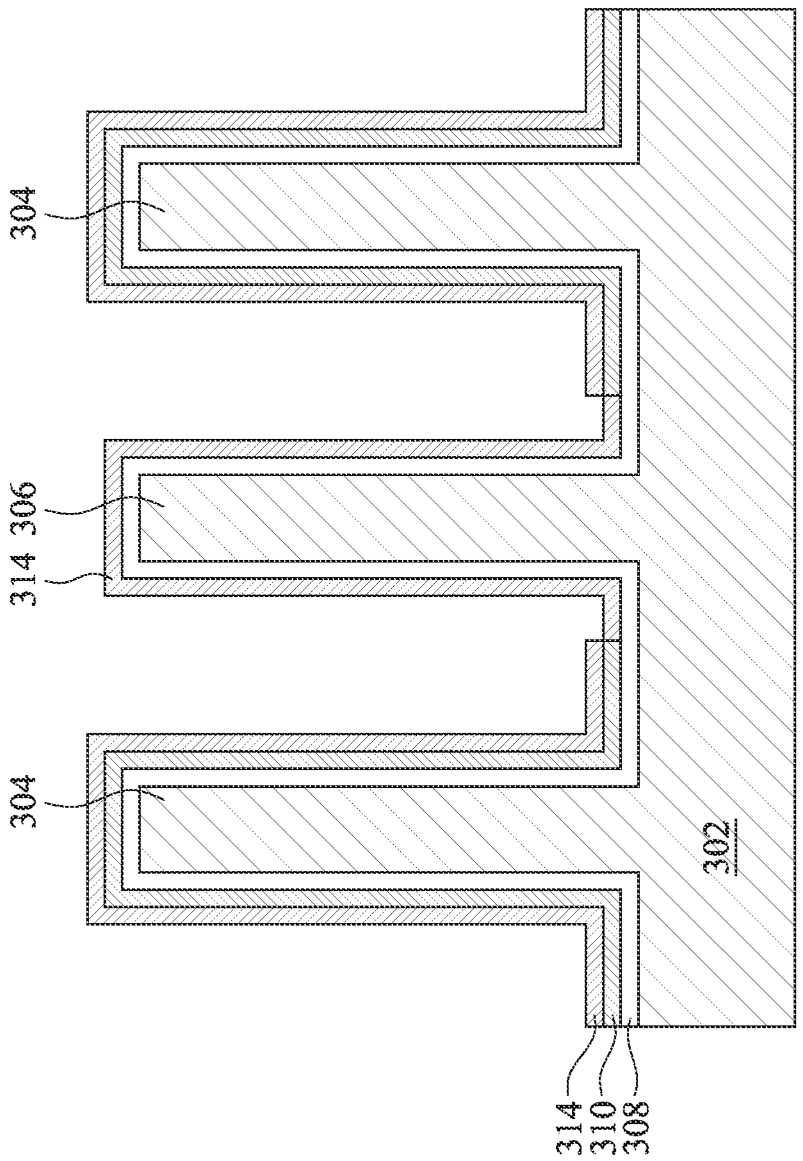
Figure 3G:
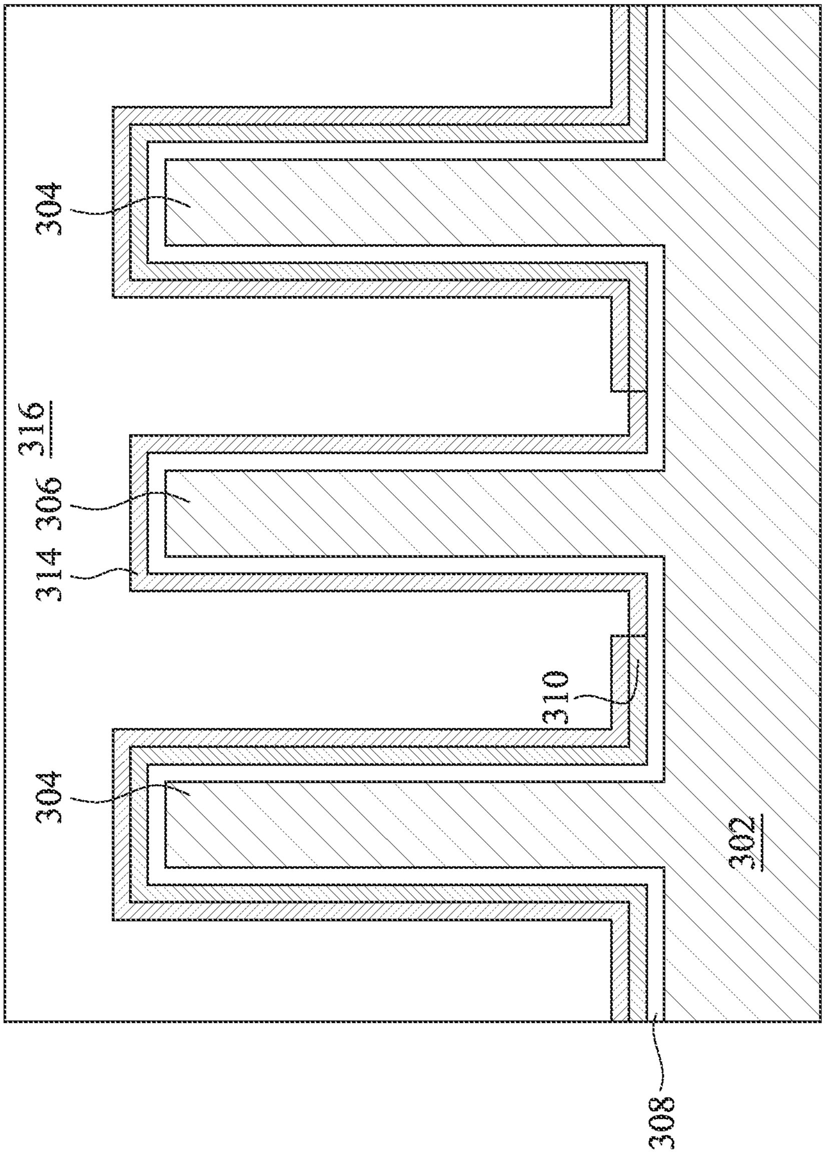
Figure 3H:
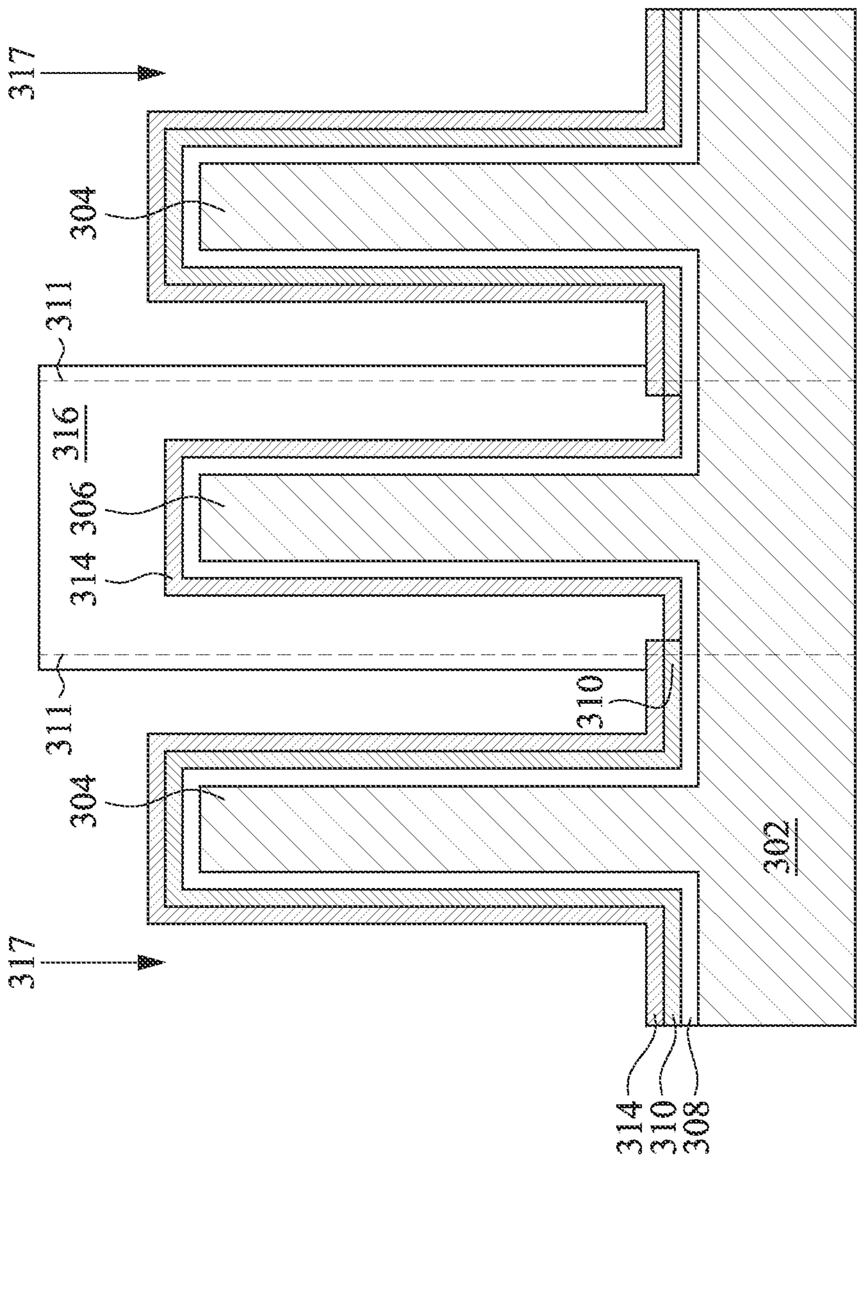
Figure 3I:
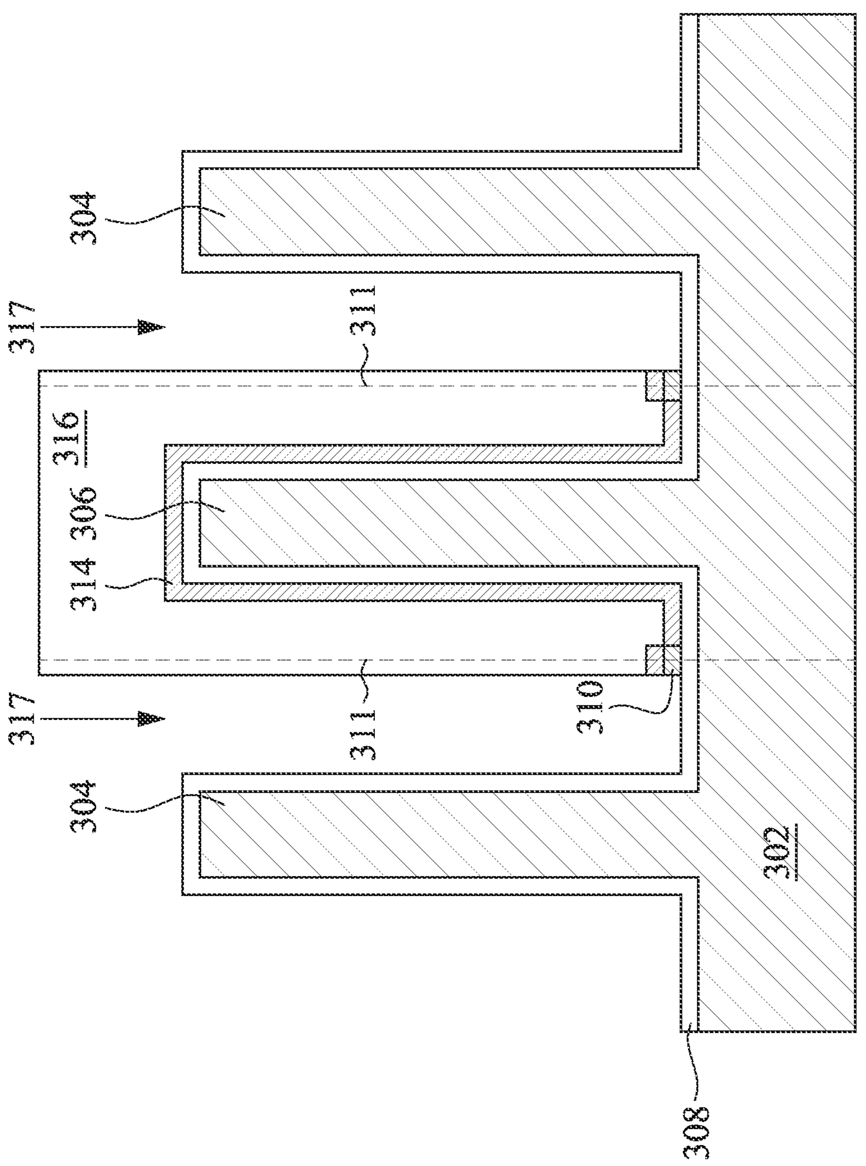
Figure 3J:
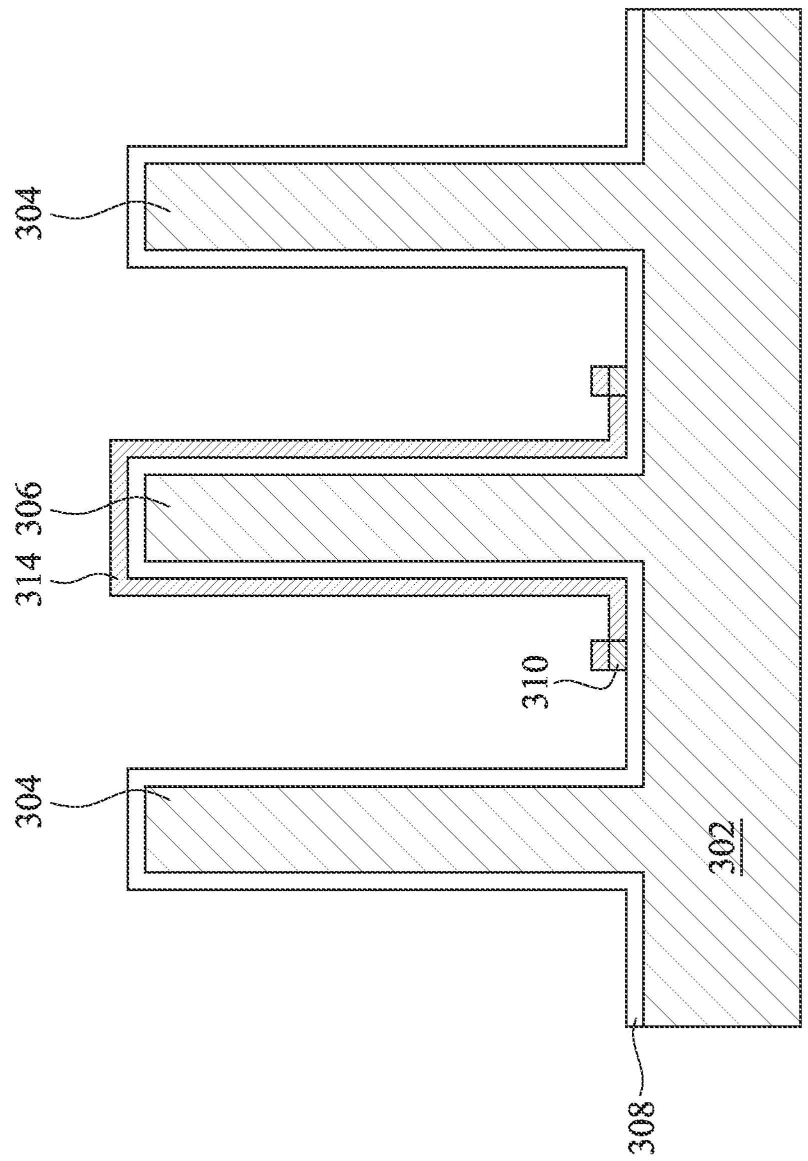
Figure 3K:
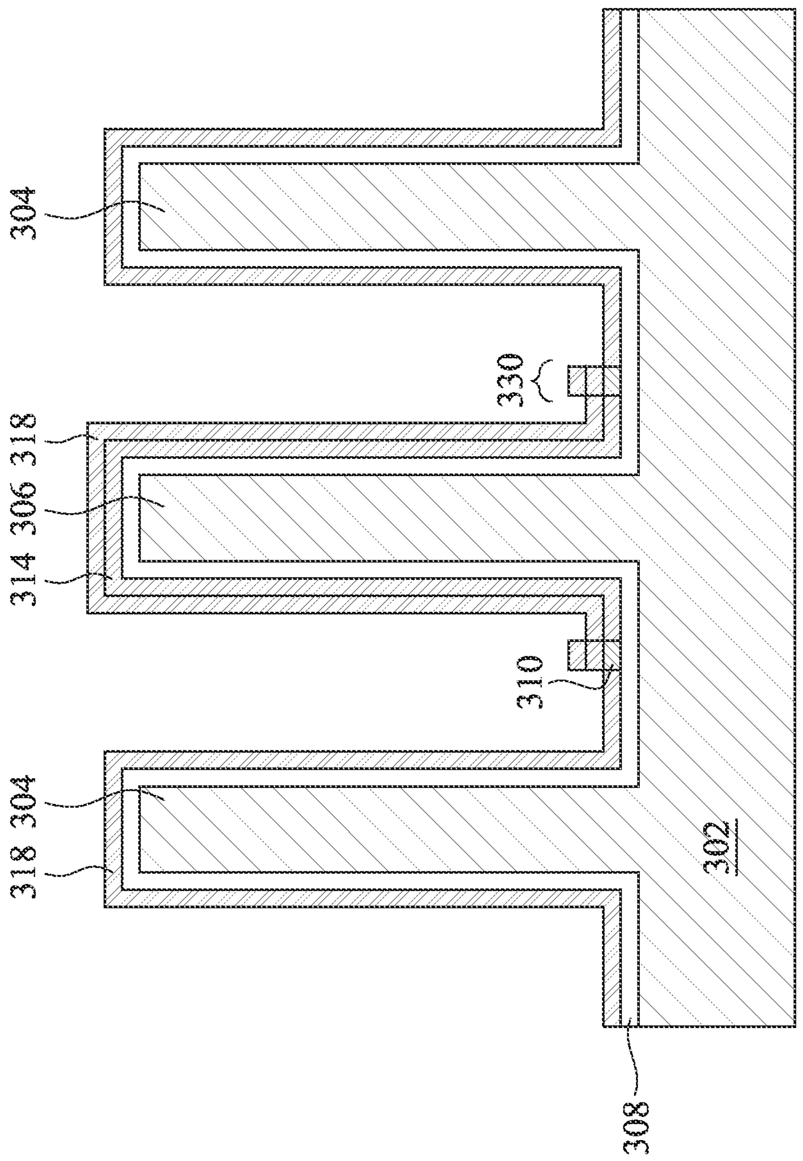
Figure 3L:
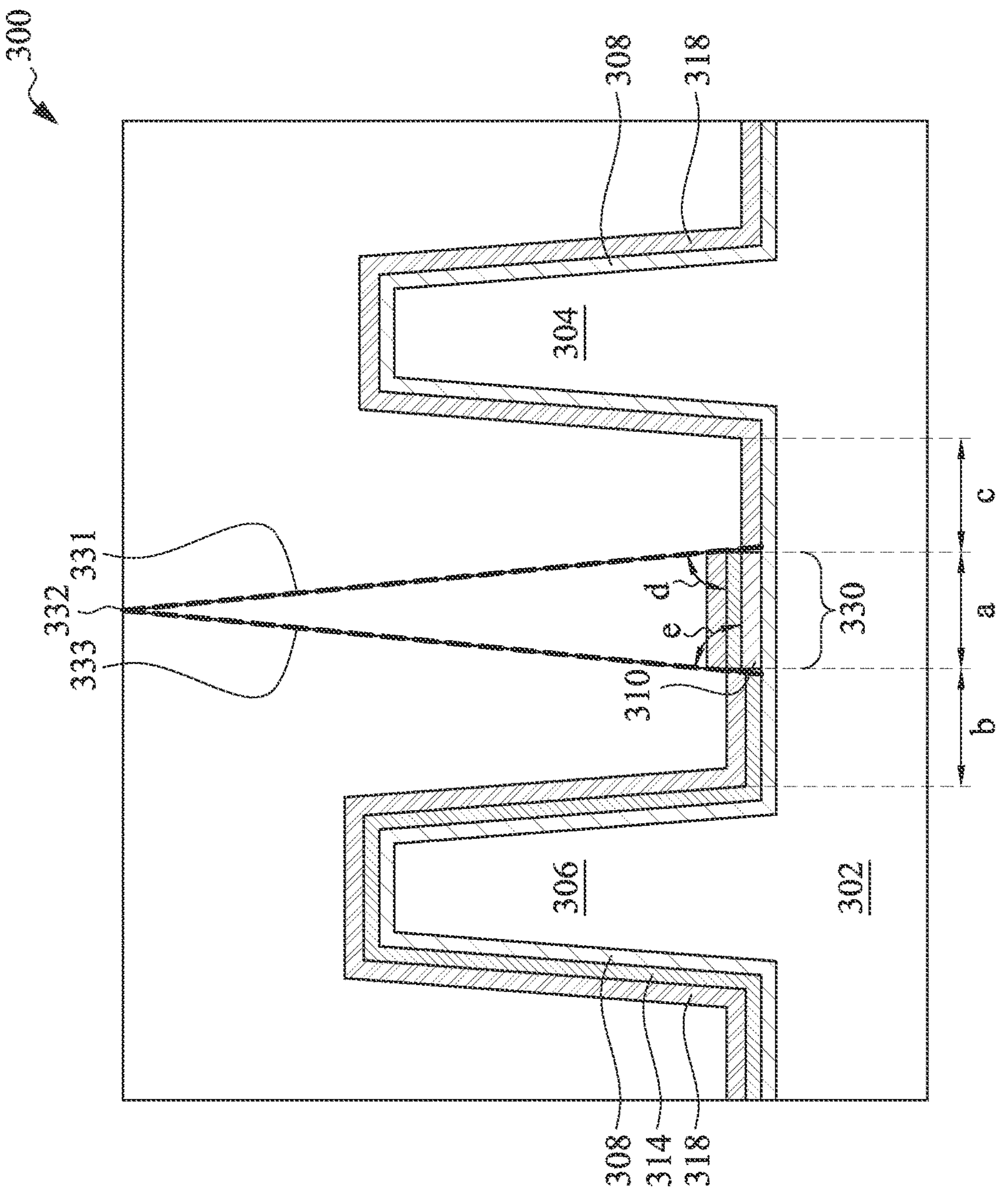

FIG. 3L depicts an expanded view of a portion of area 300 to highlight example aspects of a barrier layer region 330. In an embodiment, at the barrier layer region 330, a bottom dimension of the first work function metal layer 310 has a dimension a that is greater than 0 nm (nanometer) and less than 70 nm ($0<a<70$ nm). In an embodiment, the distance from an edge of the barrier layer region 330 to an edge of second work function metal layer 314 on a sidewall of first transistor type structure 306 has a dimension b that is greater than 0 nm (nanometer) and less than 70 nm ($0<b<70$ nm). In an embodiment, the distance from an edge of the barrier layer region 330 to an edge of third work function metal layer 318 on a sidewall of second transistor type structure 304 has a dimension c that is greater than 0 nm (nanometer) and less than 70 nm ($0<c<70$ nm). In an embodiment, the dimension b plus dimension c is less than 70 nm ($b+c<70$ nm).

FIG. 3L also depicts a first line segment 331 extending from a boundary point 332 between the first transistor type structure 306 and the second transistor type structure 304 and extending to a bottom edge of the third work function metal layer 318 in the barrier layer region 330. A second line segment 333 extending from the boundary point 332 to a bottom edge of the second work function metal layer 314 in the barrier layer region 330 is also depicted. An angle d between the first line segment 331 and a bottom of the third work function metal layer 318 in the barrier layer region 330 is greater than or equal to 45° and less than or equal to 90° ($45° \leq d \leq 90°$). Also, an angle e between the second line segment 333 and a bottom of the second work function metal layer 314 in the barrier layer region 330 is greater than or equal to 45° and less than or equal to 90° ($45° \leq e \leq 90°$).

Figure 4:
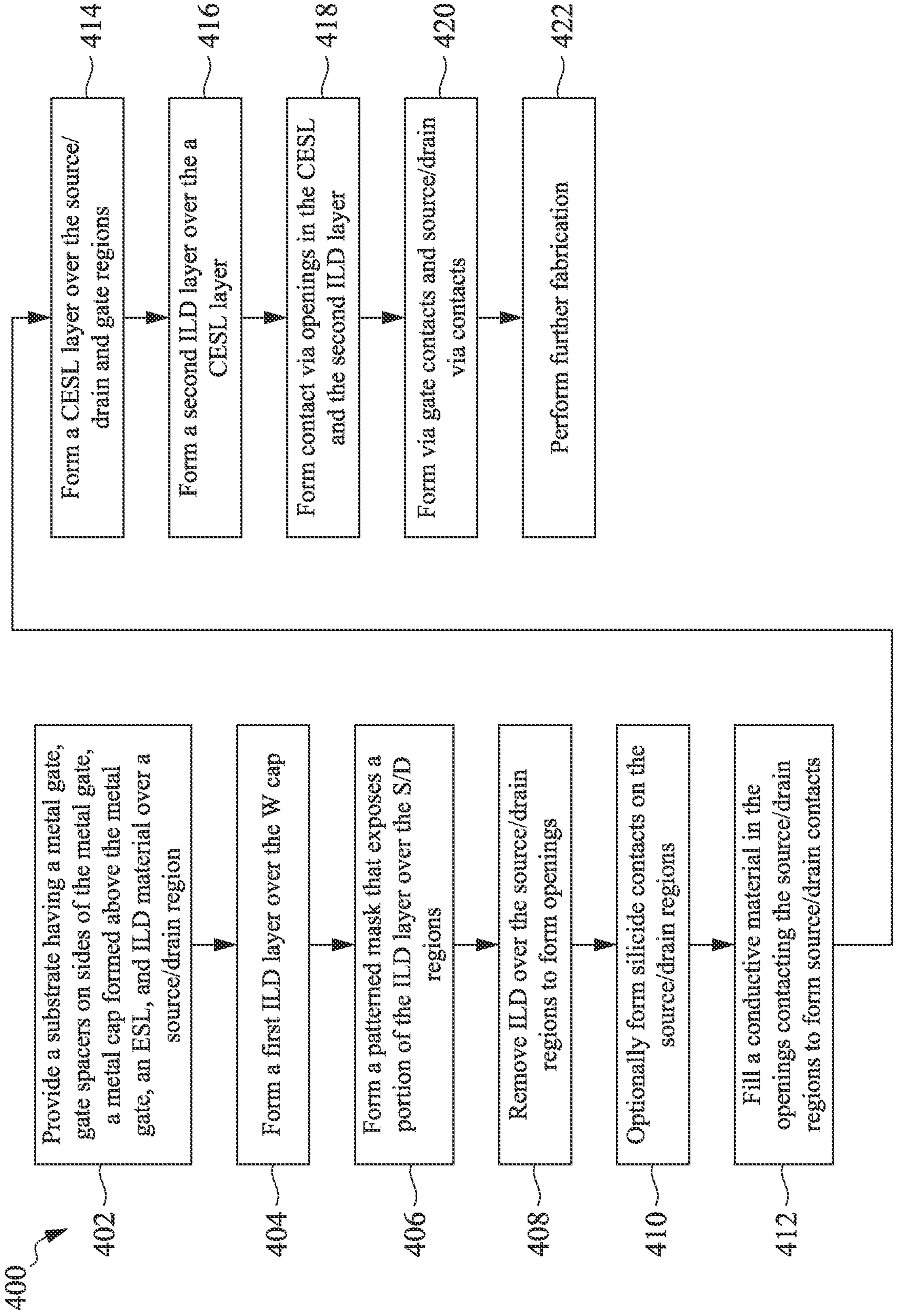
FIG. 4 is a process flow chart depicting an example method of semiconductor fabrication that includes metal drain (MD) fabrication and via gate (VG) fabrication after metal gate formation, in accordance with some embodiments, in accordance with some embodiments.

FIG. 4 is a process flow chart depicting an example method 400 of semiconductor fabrication that includes metal drain (MD) fabrication and via gate (VG) fabrication after metal gate formation, in accordance with some embodiments. The method 400 is merely an example and is not intended to limit the present disclosure beyond what is explicitly recited in the claims. Additional steps may be provided before, during, and after method 400, and some of the steps described can be moved, replaced, or eliminated for additional embodiments of method 400. Additional features may be added in the integrated circuit depicted in the figures, and some of the features described below can be replaced, modified, or eliminated in other embodiments.

FIG. 4 is described in conjunction with FIGS. 5A-5E, wherein FIGS. 5A-5E are diagrams depicting expanded views of an example area 500 at various stages of semiconductor fabricating including metal drain fabrication and via gate fabrication, in accordance with some embodiments. In some figures, some reference numbers of components or features illustrated therein may be omitted to avoid obscuring other components or features; this is for ease of depicting the figures.

At block 402, the example method 400 includes providing a substrate having a metal gate, gate spacers on sides of the metal gate, a metal cap formed above the metal gate, an etch stop layer (ESL), and interlayer dielectric (ILD) material over a source/drain region.

At block 404, the example method 400 includes forming a first ILD layer over the metal cap. The first ILD layer may include or be a material such as silicon nitride (SiN), although other suitable materials, such as silicon oxide (SiO2), aluminum oxide (AlO), silicon oxycarbide (SiOC), silicon carbon (SiC), zirconium nitride (ZrN), zirconium oxide (ZrO), combinations of these, or the like, may also be utilized. The first ILD layer may be deposited using a deposition process such as plasma enhanced atomic layer deposition (PEALD), thermal atomic layer deposition (thermal ALD), plasma enhanced chemical vapor deposition (PECVD), or others. Any suitable deposition process and process conditions may be utilized.

At block 406, the example method 400 includes forming a patterned mask that exposes a portion of the ILD material over the source/drain regions. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Figure 5A:
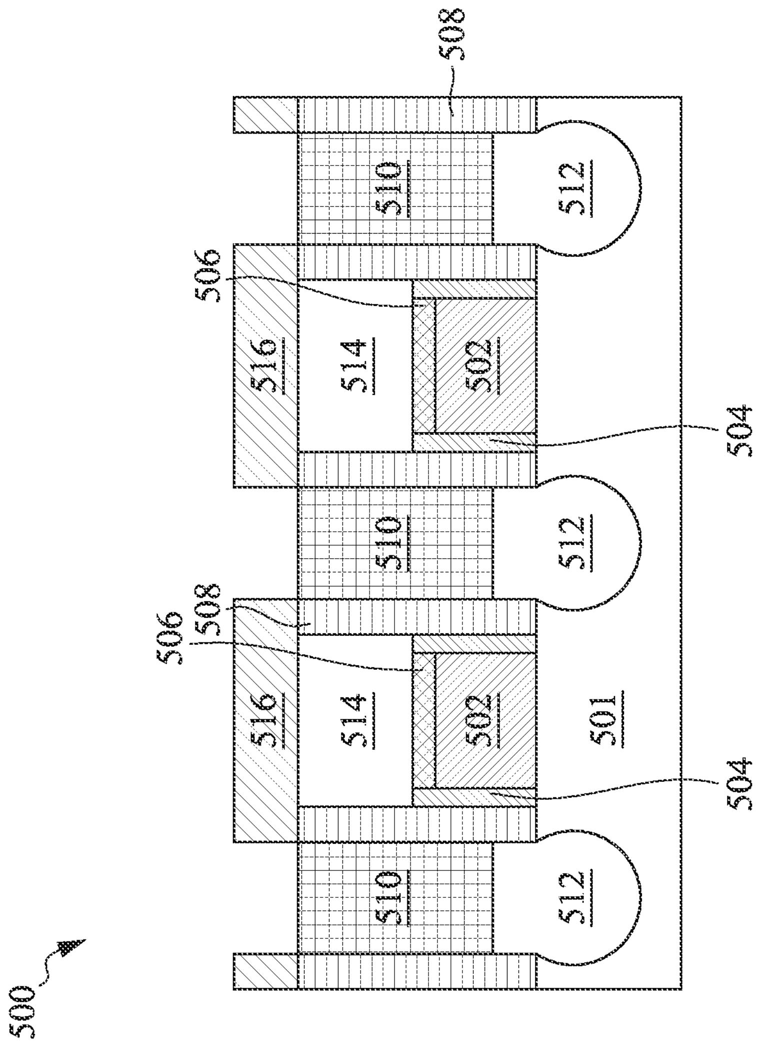
FIGS. 5A-5E are diagrams depicting expanded views of an example area at various stages of semiconductor fabricating including metal drain fabrication and via gate fabrication, in accordance with some embodiments.

Referring to the example of FIG. 5A, in an embodiment after completion of blocks 402, 404, and 406, an area 500 including a substrate 501 having a metal gate stack 502, gate spacers 504 on sides of the metal gate stack 502, a metal cap 506 formed above the metal gate stack 502, an etch stop layer (ESL) 508, ILD material 510 over a source/drain region 512, a first ILD layer 514 over the metal cap 506 and a patterned mask 516 that exposes a portion of the ILD material 510 over the source/drain regions 512 is illustrated.

At block 408, the example method 400 includes removing ILD material over the source/drain regions to form openings that expose the underlying source/drain regions. The exposed portion of the ILD material can be removed by suitable etching process, such as wet etching, dry etching, or combination thereof.

At block 410, the example method 400 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions.

Figure 5B:
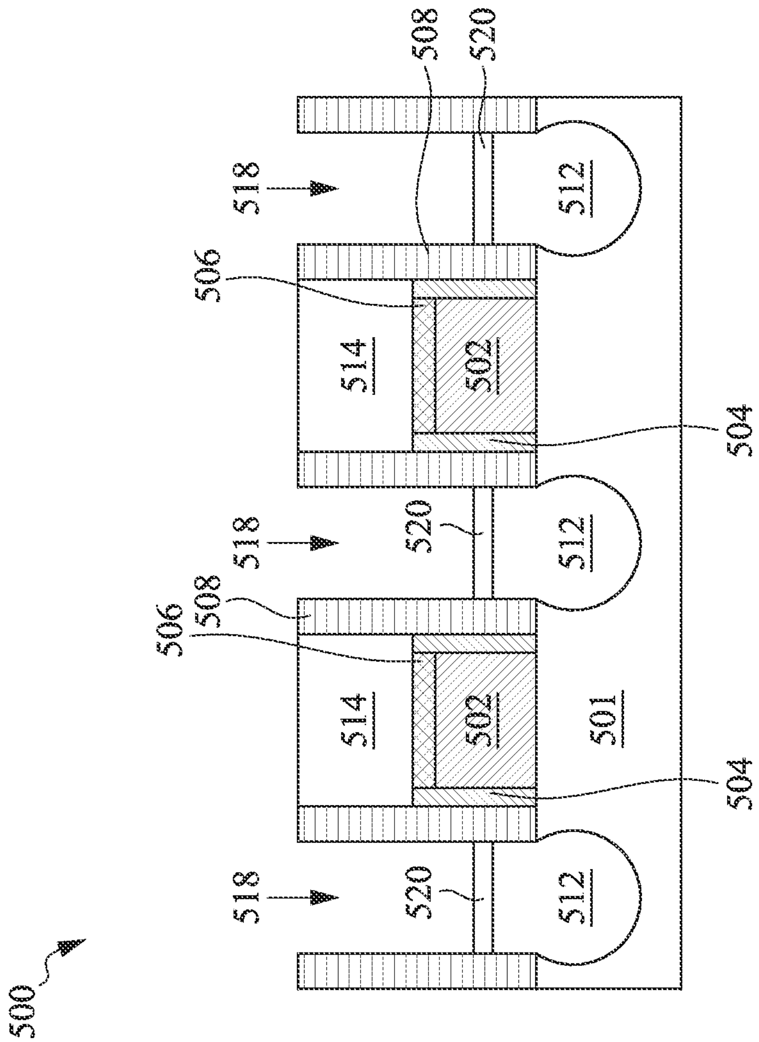

Referring to the example of FIG. 5B, in an embodiment after completion of blocks 408 and 410, the area 500 includes openings 518 that expose underlying source/drain regions 512 and optionally formed silicide contacts 520 on the source/drain regions 512 that have been exposed. The figure depicts that the ILD material 510 over the source/drain regions 512 has been removed to form the openings 518 that expose underlying source/drain regions 512.

At block 412, the example method 400 includes filling a conductive material in the openings contacting the source/drain regions to form source/drain contacts. The source/drain contact may comprise one or more layers. For example, in some embodiments, the source/drain contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening.

Figure 5C:
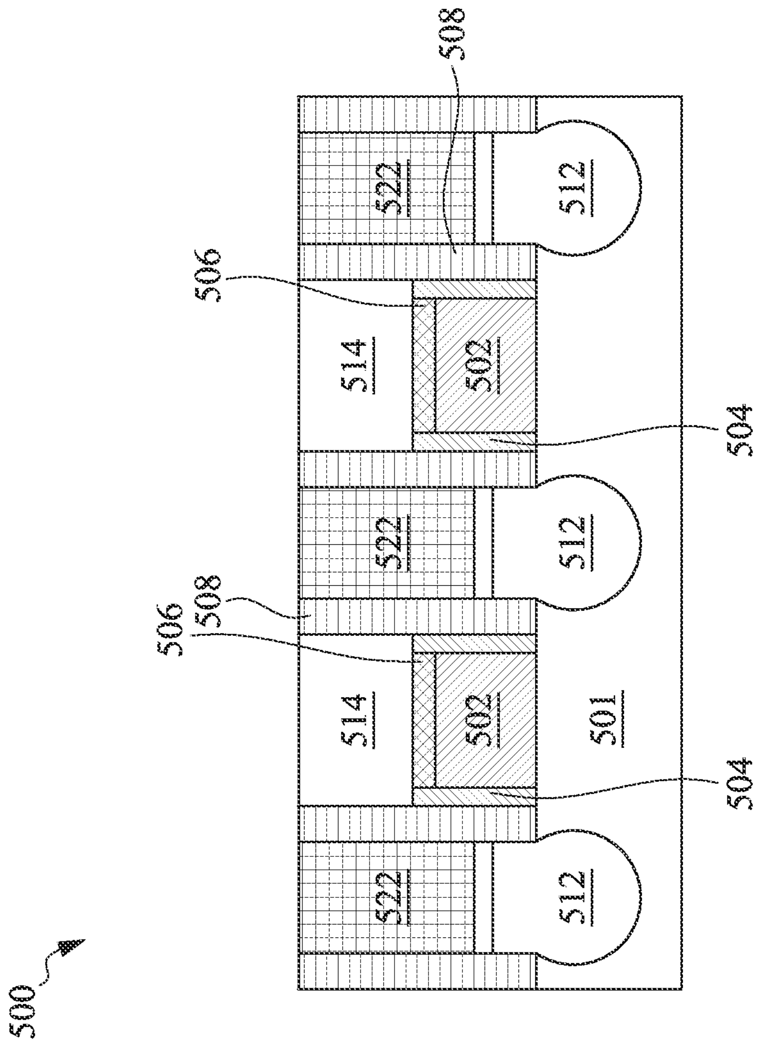

Referring to the example of FIG. 5C, in an embodiment after completion of block 412, the area 500 includes a conductive material filling the openings 518 and contacting the source/drain regions 512 to form source/drain contacts 522.

At block 414, the example method 400 includes forming a contact etch stop layer (CESL) layer over the source/drain and gate regions. The CESL may be deposited using one or more low temperature deposition processes such as chemical vapor deposition, physical vapor deposition, or atomic layer deposition.

At block 416, the example method 400 includes forming a second ILD layer over the CESL layer. The second ILD layer may be formed of a dielectric material such as oxides (e.g., silicon oxide (SiO2)) and may be deposited over the CESL by any acceptable process (e.g., CVD, PEALD, thermal ALD, PECVD, or the like). The second ILD layer may also be formed of other suitable insulation materials (e.g., PSG, BSG, BPSG, USG, or the like) deposited by any suitable method (e.g., CVD, PECVD, flowable CVD, or the like). After formation, the second ILD layer may be cured, such as by an ultraviolet curing process.

Figure 5D:
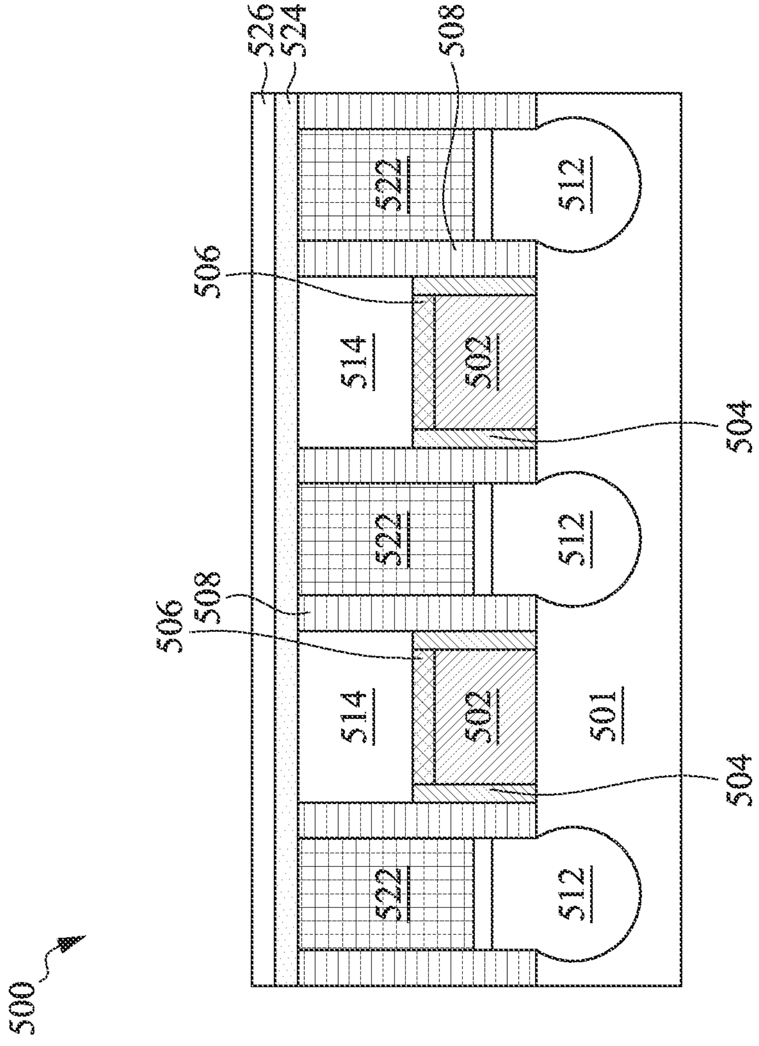

Referring to the example of FIG. 5D, in an embodiment after completion of blocks 414 and 416, the area 500 includes a CESL layer 524 formed over the source/drain and gate regions and a second ILD layer 526 formed over the CESL layer 524.

At block 418, the example method 400 includes forming contact via openings in the CESL and the second ILD layer for gate via contacts and for source/drain via contacts. Contact via openings for the gate via contact and the source/drain via contact are formed through using one or more etching processes. According to some embodiments, openings for the gate via contact are formed through the second ILD layer, the CESL, and the first ILD layer and openings for the source/drain via contact are formed through the second ILD layer and the CESL. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact via openings.

At block 420, the example method 400 includes forming via gate contacts and source/drain via contacts. The gate via contact is formed over and electrically coupled to the metal cap and the source/drain via contact is formed over and electrically coupled to source/drain contacts. The via gate contacts and/or the source/drain via contacts can be formed by depositing metal material in the opening. The metal material may be deposited by CVD, ALD, electroless deposition (ELD), PVD, electroplating, or another deposition technique. The via gate contacts and/or the source/drain via contacts may be or comprise tungsten, cobalt, copper, ruthenium, aluminum, gold, silver, alloys thereof, the like, or a combination thereof.

Figure 5E:
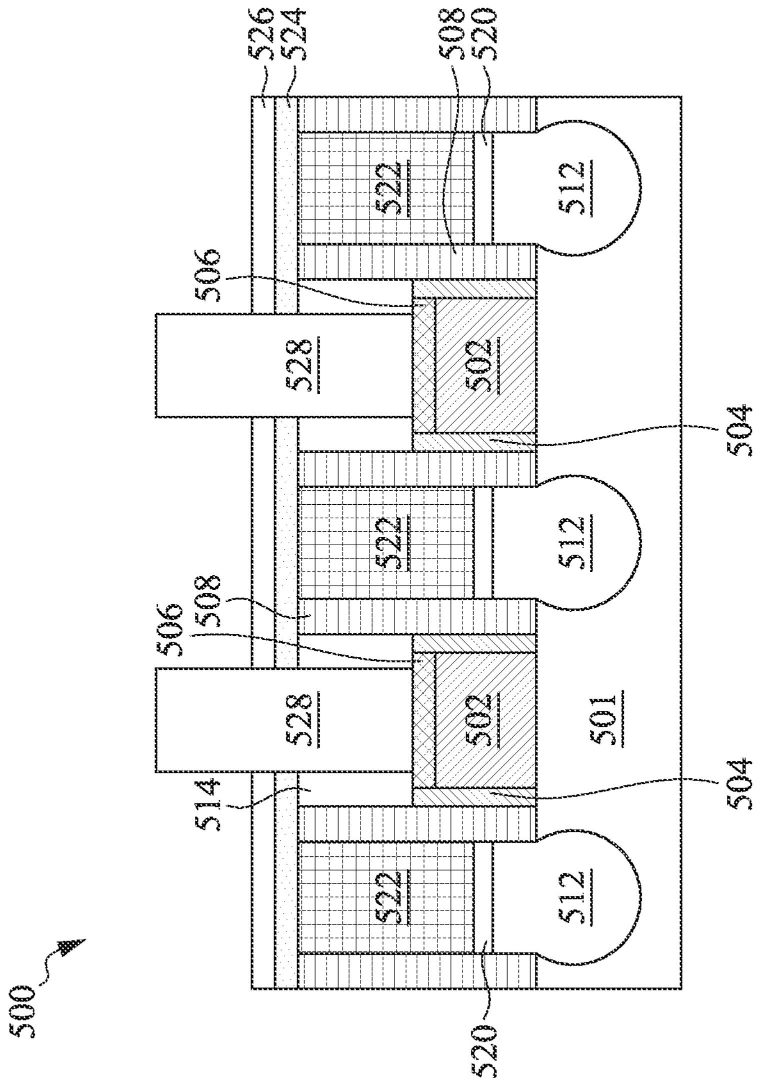

Referring to the example of FIG. 5E, in an embodiment after completion of blocks 418 and 420, the area 500 includes via gate contacts 528 and source/drain via contacts (not shown).

At block 422, the example method 400 includes performing further fabrication operations. A semiconductor device may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 400, and some process steps described above may be replaced or eliminated in accordance with various embodiments of the method 400.

In an embodiment, a method of forming gates in a semiconductor device having at least two different types of semiconductor structures (e.g., a p-type FinFET structure and an n-type FinFET structure) is disclosed. The method includes: forming a first metal layer (e.g., first work function layer) over a first semiconductor structure and a second semiconductor structure; forming a first patterned photolithographic layer (e.g., photoresist and/or BARC layer) over the first metal layer with an opening that exposes a portion of the first metal layer over the first semiconductor structure but not completely to a boundary between the first semiconductor structure and the second semiconductor structure; removing the portion of the first metal layer over the first semiconductor structure; removing the first patterned photolithographic layer; forming a second metal layer (e.g., second work function layer) over the first semiconductor structure and the second semiconductor structure; forming a second patterned photolithographic layer over the second metal layer with an opening that exposes a portion of the second metal layer over the second semiconductor structure but not completely to a boundary between the first semiconductor structure and the second semiconductor structure; removing the portion of the second metal layer and underlying portions of the first metal layer that is over the second semiconductor structure; wherein a barrier structure is generated between the first semiconductor structure and the second semiconductor structure that includes remaining portions of the first metal layer and a portion of the second metal layer overlying the remaining portions of the first metal layer; removing the second patterned photolithographic layer; and forming a third metal layer (e.g., third work function layer) over the first semiconductor structure, the barrier structure, and the second semiconductor structure.

In an embodiment of the method, forming a first patterned photolithographic layer includes depositing a first hard mask and patterning the first hard mask using a patterning rule that exposes a portion of the first metal layer over the first semiconductor structure up to a first predetermined distance to a boundary between the first semiconductor structure and the second semiconductor structure.

In an embodiment of the method, forming a second patterned photolithographic layer includes depositing a second hard mask and patterning the second hard mask using a patterning rule that exposes a portion of the second metal layer over the second semiconductor structure up to a second predetermined distance to a boundary between the first semiconductor structure and the second semiconductor structure.

In an embodiment of the method, the first metal layer has a dimension a that is greater than 0 nm (nanometer) and less than 70 nm ($0<a<70$ nm) in the barrier structure.

In an embodiment of the method, the second metal layer has a dimension b that is greater than 0 nm (nanometer) and less than 70 nm ($0<b<70$ nm) between an edge of the barrier structure to an edge of the second metal layer on a sidewall of the first semiconductor structure.

In an embodiment of the method, the third metal layer has a dimension c that is greater than 0 nm (nanometer) and less than 70 nm ($0<c<70$ nm) between an edge of the barrier structure to an edge of the third metal layer on a sidewall of the second semiconductor structure.

In an embodiment of the method, the dimension b plus the dimension c is less than 70 nm ($b+c<70$ nm).

In an embodiment of the method, a first line segment extends from a boundary point that is between the first semiconductor structure and the second semiconductor structure and extends to a bottom edge of the third metal layer in the barrier structure, and an angle d between the first line segment and a bottom of the third metal layer in the barrier structure is greater than or equal to 45° and less than or equal to 90° ($45°\leq d\leq 90°$).

In an embodiment of the method, a second line segment extends from a boundary point that is between the first semiconductor structure and the second semiconductor structure and extends to a bottom edge of the second metal layer in the barrier structure, and an angle e between the second line segment and a bottom of the second metal layer in the barrier structure is greater than or equal to 45° and less than or equal to 90° ($45°\leq e\leq 90°$).

In another embodiment a semiconductor device having two different types of semiconductor structures on a substrate is disclosed. The semiconductor device includes: a first semiconductor structure of a first type; a second semiconductor structure of a second type; a barrier structure disposed between the first semiconductor structure and the second semiconductor structure, wherein the barrier structure has a first metal layer disposed between the first semiconductor structure and the second semiconductor structure; a second metal layer disposed over the first semiconductor structure, the second semiconductor structure, and the first metal layer of the barrier structure; and a third metal layer disposed over the second semiconductor structure and the second metal layer of the barrier structure, but not the first semiconductor structure.

In an embodiment of the device, the first metal layer has a dimension a that is greater than 0 nm (nanometer) and less than 70 nm ($0<a<70$ nm) in the barrier structure.

In an embodiment of the device, the second metal layer has a dimension b that is greater than 0 nm (nanometer) and less than 70 nm ($0<b<70$ nm) between an edge of the barrier structure to an edge of the second metal layer on a sidewall of the first semiconductor structure.

In an embodiment of the device, the third metal layer has a dimension c that is greater than 0 nm (nanometer) and less than 70 nm ($0<c<70$ nm) between an edge of the barrier structure to an edge of the third metal layer on a sidewall of the second semiconductor structure.

In an embodiment of the device, the dimension b plus the dimension c is less than 70 nm ($b+c<70$ nm).

In an embodiment of the device, a first line segment extends from a boundary point that is between the first semiconductor structure and the second semiconductor structure and extends to a bottom edge of the third metal layer in the barrier structure, and an angle d between the first line segment and a bottom of the third metal layer in the barrier structure is greater than or equal to 45° and less than or equal to 90° ($45°\leq d\leq 90°$).

In an embodiment of the device, a second line segment extends from a boundary point that is between the first semiconductor structure and the second semiconductor structure and extends to a bottom edge of the second metal layer in the barrier structure, and an angle e between the second line segment and a bottom of the second metal layer in the barrier structure is greater than or equal to 45° and less than or equal to 90° ($45°\leq e\leq 90°$).

In an embodiment of the device, the barrier structure was formed by patterning a first hard mask using a patterning rule that exposed a portion of the first metal layer over the first semiconductor structure up to a first predetermined distance to a boundary between the first semiconductor structure and the second semiconductor structure and by patterning a second hard mask using a patterning rule that exposed a portion of the second metal layer over the second semiconductor structure up to a second predetermined distance to a boundary between the first semiconductor structure and the second semiconductor structure.

In another embodiment of a method of forming a semiconductor device having at least two different types of semiconductor structures is disclosed. The method includes: forming a first metal layer over a first semiconductor structure and a second semiconductor structure; forming a first patterned photolithographic layer over the first metal layer using a patterning rule that exposes a portion of the first metal layer over the first semiconductor structure up to a first predetermined distance to a boundary between the first semiconductor structure and the second semiconductor structure; removing the portion of the first metal layer over the first semiconductor structure and the first patterned photolithographic layer; forming a second metal layer over the first semiconductor structure and the second semiconductor structure; forming a second patterned photolithographic layer over the second metal layer using a patterning rule that exposes a portion of the second metal layer over the second semiconductor structure up to a second predetermined distance to a boundary between the first semiconductor structure and the second semiconductor structure; removing the portion of the second metal layer, underlying portions of the first metal layer that is over the second semiconductor structure, and the second patterned photolithographic layer; wherein a barrier structure is generated between the first semiconductor structure and the second semiconductor structure that includes remaining portions of the first metal layer and a portion of the second metal layer overlying the remaining portions of the first metal layer; and forming a third metal layer over the first semiconductor structure, the barrier structure, and the second semiconductor structure.

In an embodiment of the method, the first metal layer has a dimension a that is greater than 0 nm (nanometer) and less than 70 nm ($0<a<70$ nm) in the barrier structure; the second metal layer has a dimension b that is greater than 0 nm (nanometer) and less than 70 nm ($0<b<70$ nm) between an edge of the barrier structure to an edge of the second metal layer on a sidewall of the first semiconductor structure; the third metal layer has a dimension c that is greater than 0 nm (nanometer) and less than 70 nm ($0<c<70$ nm) between an edge of the barrier structure to an edge of the third metal layer on a sidewall of the second semiconductor structure; and the dimension b plus the dimension c is less than 70 nm ($b+c<70$ nm).

In an embodiment of the method, a first line segment extends from a boundary point that is between the first semiconductor structure and the second semiconductor structure and extends to a bottom edge of the third metal layer in the barrier structure; a second line segment extends from a boundary point that is between the first semiconductor structure and the second semiconductor structure and extends to a bottom edge of the second metal layer in the barrier structure; an angle d between the first line segment and a bottom of the third metal layer in the barrier structure is greater than or equal to 45° and less than or equal to 90° ($45°\leq d\leq 90°$); and an angle e between the second line segment and a bottom of the second metal layer in the barrier structure is greater than or equal to 45° and less than or equal to 90° ($45°\leq e\leq 90°$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming gates in a semiconductor device having at least two different types of semiconductor structures, the method comprising:

forming a first metal layer over a first semiconductor structure and a second semiconductor structure;

forming a first patterned photolithographic layer over the first metal layer with an opening that exposes a portion of the first metal layer over the first semiconductor structure but not completely to a boundary between the first semiconductor structure and the second semiconductor structure;

removing the portion of the first metal layer over the first semiconductor structure;

removing the first patterned photolithographic layer;

forming a second metal layer over the first semiconductor structure and the second semiconductor structure;

forming a second patterned photolithographic layer over the second metal layer with an opening that exposes a portion of the second metal layer over the second semiconductor structure but not completely to a boundary between the first semiconductor structure and the second semiconductor structure;

removing the portion of the second metal layer and underlying portions of the first metal layer that is over the second semiconductor structure;

wherein a barrier structure is generated between the first semiconductor structure and the second semiconductor structure that includes remaining portions of the first metal layer and a portion of the second metal layer overlying the remaining portions of the first metal layer;

removing the second patterned photolithographic layer; and forming a third metal layer over the first semiconductor structure, the barrier structure, and the second semiconductor structure.

2. The method of claim 1, wherein forming a first patterned photolithographic layer comprises:

depositing a first hard mask; and patterning the first hard mask using a patterning rule that exposes a portion of the first metal layer over the first semiconductor structure up to a first predetermined distance to a boundary between the first semiconductor structure and the second semiconductor structure.

3. The method of claim 2, wherein forming a second patterned photolithographic layer comprises:

depositing a second hard mask; and patterning the second hard mask using a patterning rule that exposes a portion of the second metal layer over the second semiconductor structure up to a second predetermined distance to a boundary between the first semiconductor structure and the second semiconductor structure.

4. The method of claim 1, wherein the first metal layer has a dimension a that is greater than 0 nm (nanometer) and less than 70 nm ($0<a<70$ nm) in the barrier structure.

5. The method of claim 4, wherein the second metal layer has a dimension b that is greater than 0 nm (nanometer) and less than 70 nm ($0<b<70$ nm) between an edge of the barrier structure to an edge of the second metal layer on a sidewall of the first semiconductor structure.

6. The method of claim 5, wherein the third metal layer has a dimension c that is greater than 0 nm (nanometer) and less than 70 nm ($0<c<70$ nm) between an edge of the barrier structure to an edge of the third metal layer on a sidewall of the second semiconductor structure.

7. The method of claim 6, wherein the dimension b plus the dimension c is less than 70 nm ($b+c<70$ nm).

8. The method of claim 1, wherein a first line segment extends from a boundary point that is between the first semiconductor structure and the second semiconductor structure and extends to a bottom edge of the third metal layer in the barrier structure, and wherein an angle d between the first line segment and a bottom of the third metal layer in the barrier structure is greater than or equal to 45° and less than or equal to 90° ($45° \leq d \leq 90°$).

9. The method of claim 8, wherein a second line segment extends from a boundary point that is between the first semiconductor structure and the second semiconductor structure and extends to a bottom edge of the second metal layer in the barrier structure, and wherein an angle e between the second line segment and a bottom of the second metal layer in the barrier structure is greater than or equal to 45° and less than or equal to 90° ($45° \leq e \leq 90°$).

10. A method of forming a semiconductor device having at least two different types of semiconductor structures, the method comprising:

forming a first metal layer over a first semiconductor structure and a second semiconductor structure;

forming a first patterned photolithographic layer over the first metal layer using a patterning rule that exposes a portion of the first metal layer over the first semiconductor structure up to a first predetermined distance to a boundary between the first semiconductor structure and the second semiconductor structure;

removing the portion of the first metal layer over the first semiconductor structure and the first patterned photolithographic layer;

forming a second metal layer over the first semiconductor structure and the second semiconductor structure;

forming a second patterned photolithographic layer over the second metal layer using a patterning rule that exposes a portion of the second metal layer over the second semiconductor structure up to a second predetermined distance to a boundary between the first semiconductor structure and the second semiconductor structure;

removing the portion of the second metal layer, underlying portions of the first metal layer that is over the second semiconductor structure, and the second patterned photolithographic layer;

wherein a barrier structure is generated between the first semiconductor structure and the second semiconductor structure that includes remaining portions of the first metal layer and a portion of the second metal layer overlying the remaining portions of the first metal layer; and forming a third metal layer over the first semiconductor structure, the barrier structure, and the second semiconductor structure.

11. The method of claim 10, wherein:

the first metal layer has a dimension a that is greater than 0 nm (nanometer) and less than 70 nm ($0<a<70$ nm) in the barrier structure;

the second metal layer has a dimension b that is greater than 0 nm (nanometer) and less than 70 nm ($0<b<70$ nm) between an edge of the barrier structure to an edge of the second metal layer on a sidewall of the first semiconductor structure;

the third metal layer has a dimension c that is greater than 0 nm (nanometer) and less than 70 nm ($0<c<70$ nm) between an edge of the barrier structure to an edge of the third metal layer on a sidewall of the second semiconductor structure; and the dimension b plus the dimension c is less than 70 nm ($b+c<70$ nm).

12. The method of claim 11, wherein:

a first line segment extends from a boundary point that is between the first semiconductor structure and the second semiconductor structure and extends to a bottom edge of the third metal layer in the barrier structure;

a second line segment extends from a boundary point that is between the first semiconductor structure and the second semiconductor structure and extends to a bottom edge of the second metal layer in the barrier structure;

an angle d between the first line segment and a bottom of the third metal layer in the barrier structure is greater than or equal to 45° and less than or equal to 90° (45°≤d≤90°); and an angle e between the second line segment and a bottom of the second metal layer in the barrier structure is greater than or equal to 45° and less than or equal to 90° (45°≤e≤90°).

13. A method comprising:

providing a substrate comprising an N-type structure, a P-type structure, and a boundary region between the N-type structure and the P-type structure;

depositing a high-K dielectric layer over the N-type structure, the P-type structure, and the boundary region;

forming a first metal layer over the high-K dielectric layer in the boundary region by depositing the first metal layer over the N-type structure, the P-type structure, and the boundary region and removing the first metal layer from over the N-type structure and the P-type structure;

depositing a second metal layer over the N-type structure, the P-type structure, and the first metal layer in the boundary region;

removing the second metal layer from over the N-type structure while retaining the second metal layer over the first metal layer in the boundary region and over the P-type structure; and depositing a third metal layer over the N-type structure, the second metal layer over the P-type structure, and the second metal layer in the boundary region;

wherein a barrier structure is formed in the boundary region comprising the first metal layer disposed on the high-K dielectric layer, the second metal layer disposed over the first metal layer, and the third metal layer disposed over the second metal layer.

14. The method of claim 13, wherein the first metal layer has a dimension a that is greater than 0 nm (nanometer) and less than 70 nm (0<a<70 nm) in the barrier structure.

15. The method of claim 14, wherein the second metal layer has a dimension b that is greater than 0 nm (nanometer) and less than 70 nm (0<b<70 nm) between an edge of the barrier structure to an edge of the second metal layer on a sidewall of the P-type structure.

16. The method of claim 15, wherein the third metal layer has a dimension c that is greater than 0 nm (nanometer) and less than 70 nm (0<c<70 nm) between an edge of the barrier structure to an edge of the third metal layer on a sidewall of the N-type structure.

17. The method of claim 16, wherein the dimension b plus the dimension c is less than 70 nm (b+c<70 nm).

18. The method of claim 13, wherein a first line segment extends from a boundary point that is between the N-type structure and the P-type structure and extends to a bottom edge of the third metal layer in the barrier structure, and wherein an angle d between the first line segment and a bottom of the third metal layer in the barrier structure is greater than or equal to 45° and less than or equal to 90° (45°≤d≤90°).

19. The method of claim 18, wherein a second line segment extends from a boundary point that is between the N-type structure and the P-type structure and extends to a bottom edge of the second metal layer in the barrier structure, and wherein an angle e between the second line segment and a bottom of the second metal layer in the barrier structure is greater than or equal to 45° and less than or equal to 90° (45°≤e≤90°).

20. The method of claim 13, wherein forming the first metal layer over the high-K dielectric layer in the boundary region comprises:

depositing the first metal layer over the N-type structure and the P-type structure;

patterning a first photolithographic layer over the first metal layer that exposes the first metal layer over the P-type structure up to a first predetermined distance to a boundary between the N-type structure and the P-type structure;

removing the first metal layer exposed by the first photolithographic layer;

depositing a second metal layer over the N-type structure and the P-type structure;

patterning a second patterned photolithographic layer over the second metal layer that exposes the second metal layer over the N-type structure up to a second predetermined distance to the boundary between the N-type structure and the P-type structure; and removing the second metal layer exposed by the second patterned photolithographic layer and the first metal layer underlying the second metal layer exposed by the second patterned photolithographic layer.

* * * * *